US010622195B2

(12) United States Patent
Bise et al.

(10) Patent No.: US 10,622,195 B2
(45) Date of Patent: Apr. 14, 2020

(54) MULTI ZONE GAS INJECTION UPPER ELECTRODE SYSTEM

(75) Inventors: Ryan Bise, San Jose, CA (US);
Rajinder Dhindsa, San Jose, CA (US);
Alexei Marakhtanov, San Jose, CA (US); Lumin Li, San Jose, CA (US);
Sang Ki Nam, San Jose, CA (US); Jim Rogers, San Jose, CA (US); Eric Hudson, San Jose, CA (US); Gerardo Delgadino, San Jose, CA (US);
Andrew D. Bailey, III, San Jose, CA (US); Mike Kellogg, San Jose, CA (US); Anthony Dela Llera, San Jose, CA (US); Darrell Ehrlich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1314 days.

(21) Appl. No.: 13/438,473

(22) Filed: Apr. 3, 2012

(65) Prior Publication Data

US 2013/0126486 A1 May 23, 2013

Related U.S. Application Data

(60) Provisional application No. 61/563,510, filed on Nov. 23, 2011, provisional application No. 61/563,021, filed on Nov. 22, 2011, provisional application No. 61/563,509, filed on Nov. 23, 2011.

(51) Int. Cl.
*B23K 9/00* (2006.01)
*H01J 37/32* (2006.01)
*H01L 21/67* (2006.01)

(52) U.S. Cl.
CPC .... *H01J 37/32642* (2013.01); *H01J 37/3244* (2013.01); *H01J 37/32541* (2013.01); *H01J 37/32724* (2013.01); *H01L 21/67109* (2013.01)

(58) Field of Classification Search
CPC ................. H01L 21/67109; H01L 21/67115
USPC .... 219/121.36, 121.43, 391, 392, 444.1, 61, 219/121.52; 438/247, 253, 729;
(Continued)

(56) References Cited

U.S. PATENT DOCUMENTS

| 4,340,462 A | 7/1982 | Koch |
| 5,183,990 A | 2/1993 | Enyedy |
| 5,304,250 A * | 4/1994 | Sameshima et al. ... 118/723 ER |

(Continued)

FOREIGN PATENT DOCUMENTS

| EP | 1 155 164 B1 | 7/2010 |
| JP | 5166595 | 7/1993 |

(Continued)

OTHER PUBLICATIONS

PCT International Search Report—PCT/US2012/065333—(dated Jan. 28, 2013) (3 pages).

(Continued)

*Primary Examiner* — Jimmy Chou
(74) *Attorney, Agent, or Firm* — Penilla IP, APC

(57) ABSTRACT

A system and method of plasma processing includes a plasma processing system including a plasma chamber and a controller coupled to the plasma chamber. The plasma chamber including a substrate support and an upper electrode opposite the substrate support, the upper electrode having a plurality of concentric gas injection zones.

11 Claims, 19 Drawing Sheets

(58) Field of Classification Search
USPC .......... 156/345.51, 345.44, 345.37; 392/416, 392/418
See application file for complete search history.

(56) References Cited

U.S. PATENT DOCUMENTS

| | | | |
|---|---|---|---|
| 5,349,271 A | 9/1994 | Van Os et al. | |
| 5,620,524 A * | 4/1997 | Fan et al. | 118/726 |
| 5,689,215 A | 11/1997 | Richardson et al. | |
| 5,889,252 A | 3/1999 | Williams et al. | |
| 5,968,587 A * | 10/1999 | Frankel | 427/8 |
| 5,998,933 A | 12/1999 | Shun'ko | |
| 6,023,405 A * | 2/2000 | Shamouilian et al. | 361/234 |
| 6,150,628 A | 11/2000 | Smith et al. | |
| 6,264,788 B1 * | 7/2001 | Tomoyasu et al. | 156/345.43 |
| 6,302,964 B1 * | 10/2001 | Umotoy et al. | 118/715 |
| 6,302,965 B1 * | 10/2001 | Umotoy et al. | 118/715 |
| 6,335,293 B1 | 1/2002 | Luo et al. | |
| 6,337,460 B2 | 1/2002 | Kelkar et al. | |
| 6,392,351 B1 | 5/2002 | Shun'ko | |
| 6,432,260 B1 | 8/2002 | Mahoney et al. | |
| 6,494,958 B1 * | 12/2002 | Shamouilian et al. | 118/728 |
| 6,527,911 B1 | 3/2003 | Yen et al. | |
| 6,528,751 B1 * | 3/2003 | Hoffman et al. | 219/121.43 |
| 6,557,248 B1 | 5/2003 | Shamouilian et al. | |
| 6,646,233 B2 * | 11/2003 | Kanno et al. | 219/390 |
| 6,825,618 B2 | 11/2004 | Pu et al. | |
| 6,855,906 B2 | 2/2005 | Brailove | |
| 6,872,259 B2 | 3/2005 | Strang | |
| 6,924,455 B1 | 8/2005 | Chen et al. | |
| 7,363,876 B2 | 4/2008 | Lai et al. | |
| 7,393,432 B2 * | 7/2008 | Dhindsa et al. | 156/345.44 |
| 7,581,511 B2 * | 9/2009 | Mardian et al. | 118/723 MW |
| 7,619,179 B2 * | 11/2009 | Hayashi | 219/121.52 |
| 7,683,289 B2 * | 3/2010 | Dhindsa et al. | 219/121.43 |
| 7,712,434 B2 | 5/2010 | Dhindsa et al. | |
| 7,829,815 B2 * | 11/2010 | Chen et al. | 219/121.48 |
| 7,939,778 B2 | 5/2011 | Larson et al. | |
| 8,012,306 B2 | 9/2011 | Dhindsa | |
| 8,056,503 B2 | 11/2011 | Kikuchi et al. | |
| 8,293,068 B2 | 10/2012 | Koshimizu et al. | 156/345.47 |
| 8,485,128 B2 * | 7/2013 | Kellogg et al. | 118/723 I |
| 8,522,716 B2 | 9/2013 | Kadkhodayan et al. | |
| 8,552,334 B2 | 10/2013 | Tappan et al. | 219/121.48 |
| 8,618,446 B2 * | 12/2013 | Chang et al. | 219/391 |
| 8,674,255 B1 * | 3/2014 | Lenz et al. | 219/121.43 |
| 8,735,765 B2 | 5/2014 | Tappan et al. | 219/121.48 |
| 8,906,197 B2 * | 12/2014 | Dhindsa | 156/345.48 |
| 9,111,724 B2 * | 8/2015 | Keil | H01J 37/32091 |
| 2001/0000104 A1 | 4/2001 | Li et al. | |
| 2001/0002582 A1 | 6/2001 | Dunham | |
| 2001/0047760 A1 * | 12/2001 | Moslehi | 118/723.001 |
| 2002/0108714 A1 | 8/2002 | Doering et al. | |
| 2002/0170881 A1 * | 11/2002 | Benzing et al. | 216/67 |
| 2002/0197402 A1 * | 12/2002 | Chiang et al. | 427/255.39 |
| 2003/0000473 A1 * | 1/2003 | Chae et al. | 118/715 |
| 2003/0015965 A1 | 1/2003 | Godyak | |
| 2003/0027428 A1 * | 2/2003 | Ng et al. | 438/706 |
| 2003/0029567 A1 * | 2/2003 | Dhindsa et al. | 156/345.47 |
| 2003/0031794 A1 * | 2/2003 | Tada et al. | 427/255.391 |
| 2003/0071035 A1 * | 4/2003 | Brailove | 219/672 |
| 2003/0094903 A1 * | 5/2003 | Tao et al. | 315/111.91 |
| 2003/0098372 A1 * | 5/2003 | Kim | 239/548 |
| 2003/0136766 A1 * | 7/2003 | Hoffman et al. | 219/121.43 |
| 2003/0137251 A1 | 7/2003 | Mitrovic et al. | |
| 2003/0188685 A1 * | 10/2003 | Wang et al. | 118/715 |
| 2004/0003777 A1 * | 1/2004 | Carpenter et al. | 118/715 |
| 2004/0027781 A1 * | 2/2004 | Hanawa et al. | 361/234 |
| 2004/0040502 A1 * | 3/2004 | Basceri et al. | 118/715 |
| 2004/0040503 A1 * | 3/2004 | Basceri et al. | 118/715 |
| 2004/0047720 A1 | 3/2004 | Lerner et al. | |
| 2004/0083961 A1 * | 5/2004 | Basceri | 118/715 |
| 2004/0149699 A1 * | 8/2004 | Hofman et al. | 219/121.43 |
| 2004/0175953 A1 * | 9/2004 | Ogle | 438/710 |
| 2004/0178180 A1 * | 9/2004 | Kaji et al. | 219/121.43 |
| 2004/0226507 A1 * | 11/2004 | Carpenter et al. | 118/715 |
| 2005/0000655 A1 * | 1/2005 | Wi | 156/345.48 |
| 2005/0001556 A1 * | 1/2005 | Hoffman et al. | 315/111.91 |
| 2005/0006028 A1 * | 1/2005 | Keil et al. | 156/345.46 |
| 2005/0023254 A1 * | 2/2005 | Hayashi et al. | 219/121.43 |
| 2005/0087302 A1 * | 4/2005 | Mardian et al. | 156/345.33 |
| 2005/0160985 A1 * | 7/2005 | Brcka | 118/723.001 |
| 2005/0184670 A1 * | 8/2005 | Lacoste et al. | 315/111.41 |
| 2005/0194100 A1 | 9/2005 | Or et al. | |
| 2005/0217582 A1 * | 10/2005 | Kim et al. | 118/723 E |
| 2005/0241766 A1 * | 11/2005 | Dhindsa | H01J 37/32009 156/345.34 |
| 2005/0264218 A1 * | 12/2005 | Dhindsa et al. | 315/111.21 |
| 2005/0268856 A1 * | 12/2005 | Miller et al. | 118/729 |
| 2006/0060302 A1 * | 3/2006 | White et al. | 156/345.28 |
| 2006/0065623 A1 * | 3/2006 | Guiney et al. | 216/59 |
| 2006/0075969 A1 * | 4/2006 | Fischer | 118/725 |
| 2006/0081564 A1 * | 4/2006 | Moroz et al. | 219/121.43 |
| 2006/0118518 A1 * | 6/2006 | Rusu et al. | 216/67 |
| 2006/0237138 A1 * | 10/2006 | Qin | 156/345.51 |
| 2007/0081295 A1 * | 4/2007 | Brillhart et al. | 361/234 |
| 2007/0170155 A1 * | 7/2007 | Fink | 219/121.43 |
| 2007/0193688 A1 * | 8/2007 | Dhindsa et al. | 156/345.43 |
| 2007/0199658 A1 * | 8/2007 | Dhindsa et al. | 156/345.38 |
| 2007/0235420 A1 * | 10/2007 | Yamazawa | 219/121.36 |
| 2007/0235426 A1 * | 10/2007 | Matsumoto et al. | 219/121.43 |
| 2007/0251642 A1 * | 11/2007 | Bera et al. | 156/345.26 |
| 2008/0020574 A1 | 1/2008 | Marakhtanov et al. | |
| 2008/0041820 A1 | 2/2008 | Tong et al. | |
| 2008/0173237 A1 * | 7/2008 | Collins et al. | 118/723.1 |
| 2008/0179007 A1 * | 7/2008 | Collins et al. | 156/345.35 |
| 2008/0274297 A1 * | 11/2008 | Furuta et al. | 427/569 |
| 2008/0286697 A1 * | 11/2008 | Verhaverbeke et al. | 430/322 |
| 2008/0302652 A1 * | 12/2008 | Entley et al. | 204/157.15 |
| 2008/0302781 A1 * | 12/2008 | Murakami et al. | 219/444.1 |
| 2009/0025879 A1 * | 1/2009 | Rauf et al. | 156/345.48 |
| 2009/0047795 A1 * | 2/2009 | Matsudo | H01J 37/32091 438/729 |
| 2009/0066315 A1 * | 3/2009 | Hu et al. | 324/71.4 |
| 2009/0081878 A1 * | 3/2009 | Dhindsa | H01J 37/32091 438/729 |
| 2009/0109595 A1 | 4/2009 | Herchen et al. | |
| 2009/0149028 A1 | 6/2009 | Marakhtanov et al. | |
| 2009/0200268 A1 | 8/2009 | Tappan et al. | |
| 2009/0200269 A1 * | 8/2009 | Kadkhodayan et al. | 216/71 |
| 2009/0242135 A1 | 10/2009 | Koshimizu et al. | |
| 2009/0242516 A1 * | 10/2009 | Honda | H01J 37/32027 216/71 |
| 2009/0272492 A1 | 11/2009 | Katz et al. | |
| 2009/0277585 A1 * | 11/2009 | Maebashi et al. | 156/345.28 |
| 2009/0305509 A1 * | 12/2009 | Stevenson et al. | 438/710 |
| 2009/0321019 A1 * | 12/2009 | Chen et al. | 156/345.48 |
| 2010/0008015 A1 * | 1/2010 | Booth et al. | 361/234 |
| 2010/0008016 A1 * | 1/2010 | Onate et al. | 361/234 |
| 2010/0065215 A1 * | 3/2010 | Jeon et al. | 156/345.48 |
| 2010/0072172 A1 * | 3/2010 | Ui et al. | 216/67 |
| 2010/0096261 A1 | 4/2010 | Hoffman et al. | |
| 2010/0098875 A1 * | 4/2010 | Fischer et al. | 427/534 |
| 2010/0116788 A1 * | 5/2010 | Singh et al. | 216/66 |
| 2010/0116790 A1 * | 5/2010 | Spitzl | 216/69 |
| 2010/0140223 A1 * | 6/2010 | Tyler et al. | 216/67 |
| 2010/0147050 A1 * | 6/2010 | Barth | 73/23.42 |
| 2010/0196626 A1 | 8/2010 | Choi et al. | |
| 2010/0319852 A1 | 12/2010 | Brillhart et al. | |
| 2011/0061687 A1 | 3/2011 | Mikhaylichenko et al. | |
| 2011/0075313 A1 * | 3/2011 | Comendant | 361/121 |
| 2011/0108524 A1 | 5/2011 | Dhindsa et al. | |
| 2012/0055632 A1 * | 3/2012 | de la Llera et al. | 156/345.34 |
| 2012/0086541 A1 * | 4/2012 | Kester | 338/21 |
| 2013/0023064 A1 * | 1/2013 | Marakhtanov et al. | 438/5 |
| 2013/0059448 A1 * | 3/2013 | Marakhtanov et al. | 438/711 |
| 2013/0126475 A1 * | 5/2013 | Dhindsa et al. | 216/61 |
| 2013/0127124 A1 * | 5/2013 | Nam et al. | 279/128 |
| 2013/0133834 A1 * | 5/2013 | Dhindsa | 156/345.51 |
| 2013/0260567 A1 * | 10/2013 | Marakhtanov et al. | 438/710 |
| 2013/0340938 A1 | 12/2013 | Tappan et al. | 156/345.29 |
| 2014/0054268 A1 * | 2/2014 | Chen et al. | 216/67 |

(56) References Cited

U.S. PATENT DOCUMENTS

| | | | |
|---|---|---|---|
| 2014/0054269 A1* | 2/2014 | Hudson et al. | 216/67 |
| 2014/0065835 A1 | 3/2014 | Kadkhodayan et al. | |
| 2014/0087488 A1* | 3/2014 | Nam et al. | 438/5 |

FOREIGN PATENT DOCUMENTS

| | | |
|---|---|---|
| JP | 5144594 | 11/1993 |
| RU | 2022917 | 11/1994 |
| RU | 2056702 | 3/1996 |
| RU | 2094961 | 10/1997 |
| TW | 201043099 A | 12/2010 |
| WO | WO 01 36703 A1 | 5/2001 |

OTHER PUBLICATIONS

PCT International Search Report—PCT/US2012/063987(dated Jan. 28, 2013) (3 pages).

PCT International Search Report—PCT/US2012/065080(dated Jan. 28, 2013) (2 pages).

PCT International Search Report—PCT/US2012/065684 (dated Jan. 28, 2013) (2 pages).

PCT International Search Report—PCT/US2012/65949(dated Feb. 5, 2013 (2 pages_.

PCT International Search Report—PCT/US2012/065677(dated Feb. 7, 2013 (3 pages).

PCT International Search Report—PCT/US2012/66467(dated Feb. 8, 2013) (2 pages).

PCT International Search Report—PCT/US2012/65122—(dated Mar. 25, 2013) (2 pages).

ISR PCT US2012/066425 dated Feb. 22, 2013.

"Bera et al., "Control of Plasma Uniformity Using Phase Difference in a VHF Plasma Process Chamber," IEEE Transactions on Plasma Science, vol. 36, No. 4, Aug. 2008, p. 1366-1367."

ISR PCT/US2012/066333 dated Feb. 1, 2013, 8 pages.

ISR PCT/US2012/66302 dated Feb. 8, 2013, 7 pages.

Taiwan Search Report, App. No. 101144019, dated Sep. 22, 2014, 1 page.

English Translation of Rejection Decision (Preliminary Examination), dated Jul. 28, 2016, issued in corresponding Taiwanese Patent Application No. 101144011 (12 total pages).

PCT International Search Report—PCT/US2011/001175—dated Nov. 29, 2011 (2 pages).

PCT International Search Report—PCT/US2011/001174 dated Dec. 6, 2011 (2 pages).

PCT International Search Report—PCT/US2011/001176—dated Jan. 19, 2012 (4 pages).

\* cited by examiner

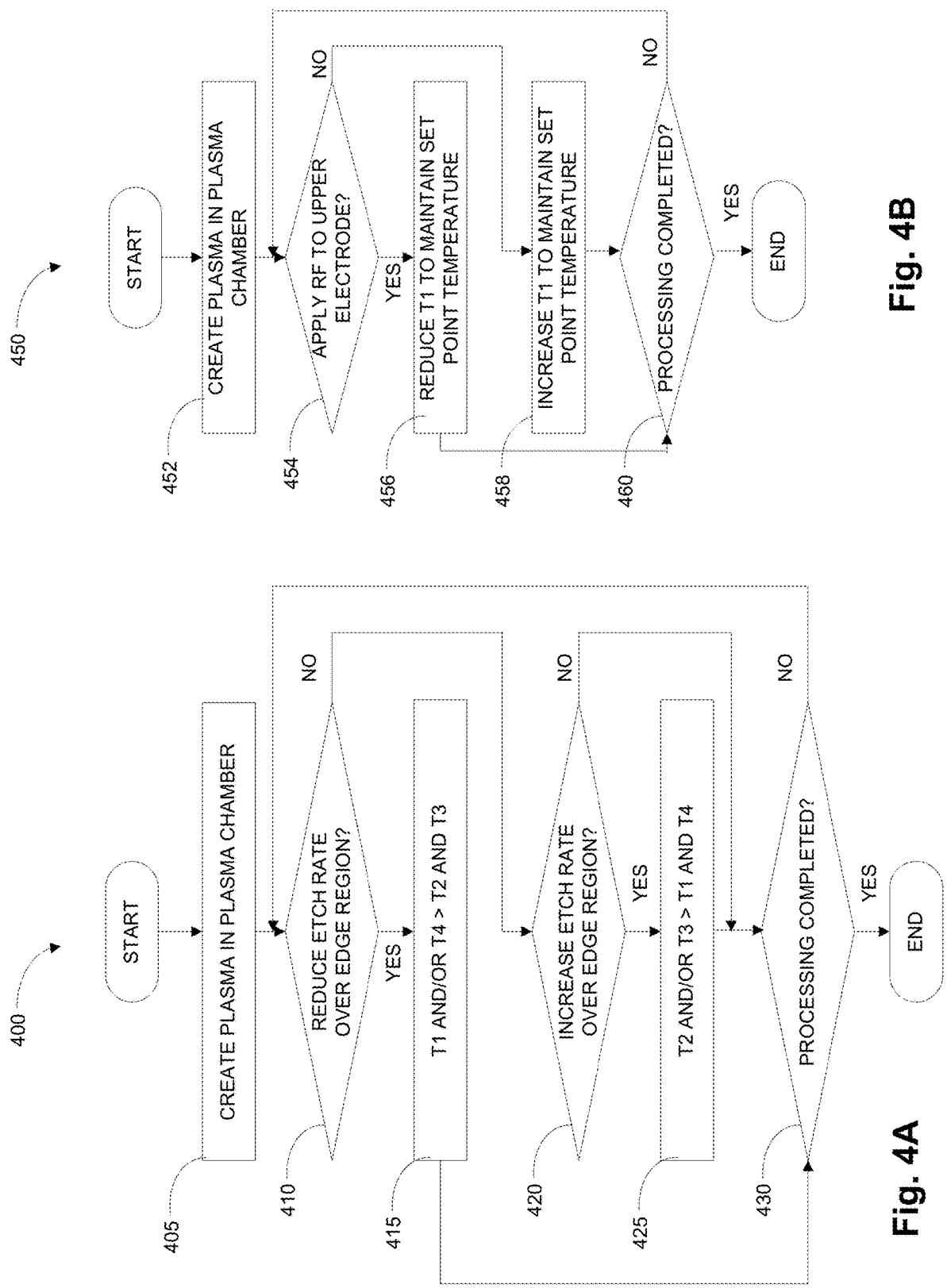

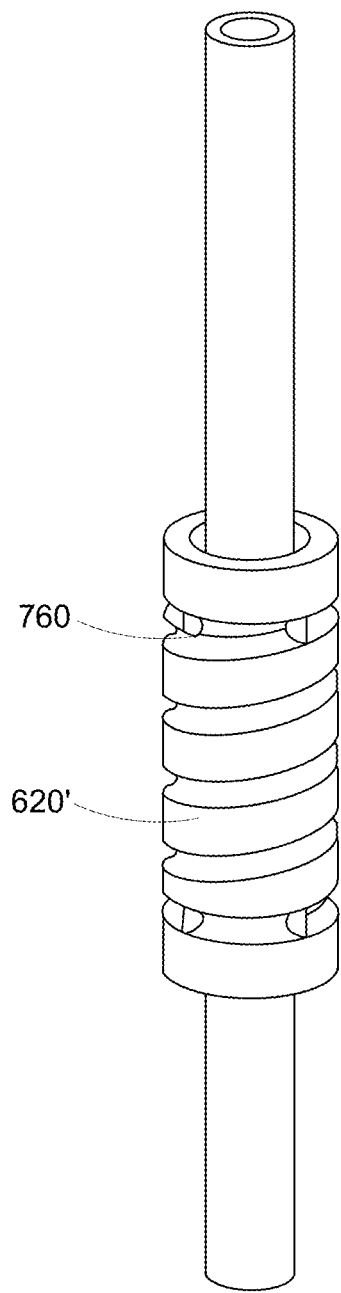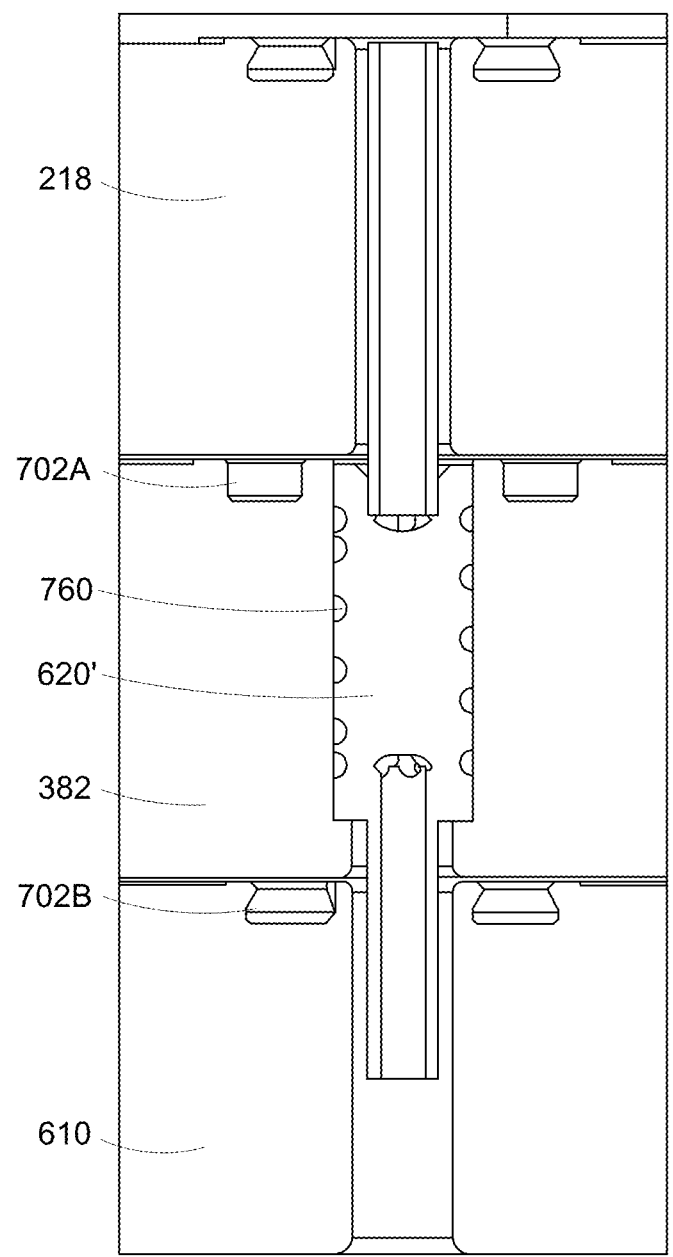
Fig. 7E
Fig. 7F

MULTI ZONE GAS INJECTION UPPER ELECTRODE SYSTEM

CROSS REFERENCE TO RELATED APPLICATIONS

This application is claims priority from U.S. Provisional Patent Application No. 61/563,510, filed Nov. 23, 2011, entitled "Multi Zone Gas Injection Upper Electrode System" which is incorporated by reference herein for all purposes. This application is related to U.S. patent application Ser. No. 13/301,725, filed Nov. 21, 2011, entitled "Triode Reactor Design with Multiple Radiofrequency Powers," and to U.S. Provisional Patent Application No. 61/563,021, filed Nov. 22, 2011, entitled "Systems And Methods For Controlling A Plasma Edge Region," the disclosures of which are incorporated herein by reference for all purposes. This application is related to U.S. Provisional Patent Application No. 61/563,509 filed on Nov. 23, 2011 and entitled "Dual Zone Temperature Control of Upper Electrodes," which is incorporated herein by reference in its entirety for all purposes.

BACKGROUND

The present invention relates generally to plasma processing methods and systems and more particularly, to methods and systems for having multiple gas injection zones on an upper electrode in a plasma chamber.

FIG. 1A is side view a typical plasma chamber 100. The typical plasma chamber 100 has a single showerhead type upper electrode 102, a substrate support 140 for supporting a substrate 130 as the substrate is being processed by a plasma 150.

FIG. 1B is a more detailed view of a typical upper electrode in the plasma chamber 100. Typically, the showerhead type upper electrode 102 includes several layers 104, 110, 120, 125. A surface layer 104 includes an exposed plasma surface 104A and multiple outlet ports 106. The exposed plasma surface 104A is the surface of the surface layer that is exposed to the plasma 150. The outlet ports are substantially evenly distributed across the plasma chamber 100 so as to maintain a uniform distribution of the process gases.

Behind the surface layer 104, is a gas distribution layer 110. The gas distribution layer 110 includes multiple gas passages 112, 114 to distribute the process gases evenly to the ports 106 across the surface layer 104. The multiple gas passages 112, 114 are coupled to one or more external process gas sources, not shown. A great amount of effort is placed in detail in the design of the multiple gas passages 112, 114 so to ensure that the multiple gas passages evenly distribute the process gases to each of the outlet ports 106 and therefore evenly throughout the plasma chamber 100.

Behind the gas distribution layer 110 is a temperature control layer 120. The temperature control layer 120 includes elements 122. Elements 122 can heat or cool the temperature control layer 120, as desired, to control the temperature of the upper electrode 102. The temperature of the upper electrode 102 is controlled as one aspect of controlling the plasma processing occurring in the plasma chamber 100. A great amount of effort is placed in the detailed design of the temperature control layer 120 so as to maintain a uniform temperature across the surface layer 104.

Unfortunately, for various reasons, the plasma processing is not always uniform across the center to edge of the substrate 130. In view of the foregoing, what is needed is a system and method of manipulating the plasma processing from the center to the edge along of the substrate 130.

SUMMARY

Broadly speaking, the present invention fills these needs by providing a system and method of manipulating the plasma processing along the center to edge of the substrate. It should be appreciated that the present invention can be implemented in numerous ways, including as a process, an apparatus, a system, computer readable media, or a device. Several inventive embodiments of the present invention are described below.

One embodiment provides a system for plasma processing including a plasma processing system including a plasma chamber and a controller coupled to the plasma chamber. The plasma chamber including a substrate support and an upper electrode opposite the substrate support, the upper electrode having a plurality of concentric gas injection zones.

Each one of the concentric gas injection zones includes multiple gas feeds, the gas feeds being evenly distributed around the corresponding gas injection zones. A first set of gas feeds in a first concentric gas injection zone can be aligned with a second set of gas feeds in a second concentric gas injection zone. A first set of gas feeds in a first concentric gas injection zone can be offset clockwise from a second set of gas feeds in a second concentric gas injection zone.

At least one of the gas feeds can include a plasma arrestor. The plasma arrestor can include multiple channels having a width too small to support a plasma. The plasma arrestor can include a ground electrode.

Each one of the concentric gas injection zones can include multiple, concentric gas plenum rings. The concentric gas plenum rings in a corresponding concentric gas injection zone are coupled together by multiple gas channels. Each one of the concentric gas injection zones can include multiple outlet ports. The plasma processing system can also include an RF source coupled to the inner upper electrode.

Another embodiment provides a plasma processing system including a plasma chamber and a controller coupled to the plasma processing chamber. The plasma chamber includes a substrate support and an upper electrode opposite the substrate support, the upper electrode having multiple, concentric gas injection zones. Each one of the concentric gas injection zones includes multiple gas feeds. The gas feeds being evenly distributed around the corresponding gas injection zones. At least one of the gas feeds includes a plasma arrestor. A first set of gas feeds in a first concentric gas injection zone are offset clockwise from a second set of gas feeds in a second concentric gas injection zone.

Yet another embodiment provides a method of selecting an etch rate using an upper electrode having multiple, concentric gas injection zones including creating a plasma in a plasma chamber, reducing a first etch rate in a first concentric gas injection zone including injecting a tuning gas in the first concentric gas injection zone and reducing a second etch rate in a second concentric gas injection zone including injecting a tuning gas in the second concentric gas injection zone.

Reducing the first etch rate in the first concentric gas injection zone can include setting at least one of a first substrate temperature in the first concentric gas injection zone or a first upper electrode temperature in the first concentric gas injection zone to a temperature greater than at least one of a second substrate temperature in a second concentric gas injection zone or a second upper electrode temperature in the second concentric gas injection zone.

Increasing a first etch rate in the first concentric gas injection zone can include setting at least one of a first substrate temperature in the first concentric gas injection zone or a first upper electrode temperature in the first concentric gas injection zone to a temperature less than at least one of a second substrate temperature in a second concentric gas injection zone or a second upper electrode temperature in the second concentric gas injection zone.

The tuning gas can reduce a carbon/fluorine ratio at a surface of a substrate to be processed. The tuning gas can include oxygen or other suitable tuning gases.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 4A is a flowchart diagram that illustrates the method operations performed in selecting an edge etch rate using a dual temperature zone upper electrode, in accordance with embodiments of the present invention.

FIG. 4B is a flowchart diagram that illustrates the method operations performed in maintaining a set point temperature of the upper electrode, in accordance with embodiments of the present invention.

FIGS. 7B-F are schematic diagrams of plasma arrestors, in accordance with embodiments of the present invention.

DETAILED DESCRIPTION

Several exemplary embodiments for system and method of manipulating the plasma processing along the center to edge of the substrate will now be described. It will be apparent to those skilled in the art that the present invention may be practiced without some or all of the specific details set forth herein.

One approach to manipulating the plasma processing along the center to edge of the substrate 130 is to vary the temperature of the upper electrode from the center 130A to edge 130B of the substrate. Another approach to manipulating the plasma processing from the center to edge of the substrate 130 is to manipulate the process gas concentrations along the center 130A to edge 130B of the substrate.

Figure 1A:
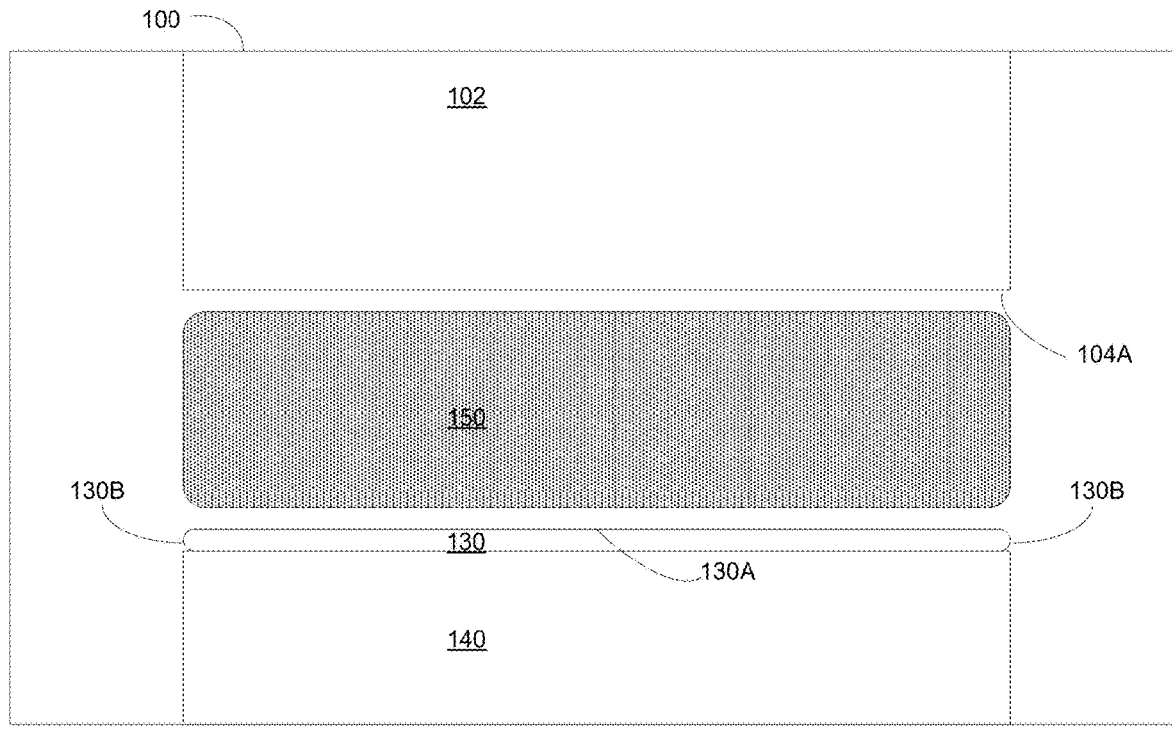
FIG. 1A is side view a typical plasma chamber.
Figure 1B:
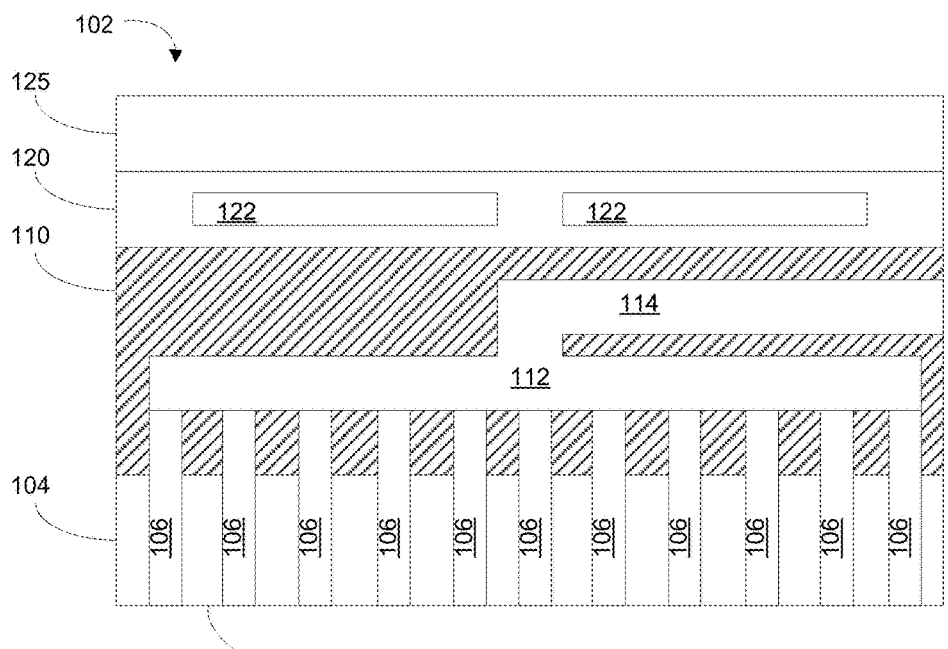
FIG. 1B is a more detailed view of a typical upper electrode in the plasma chamber.
Figure 2:
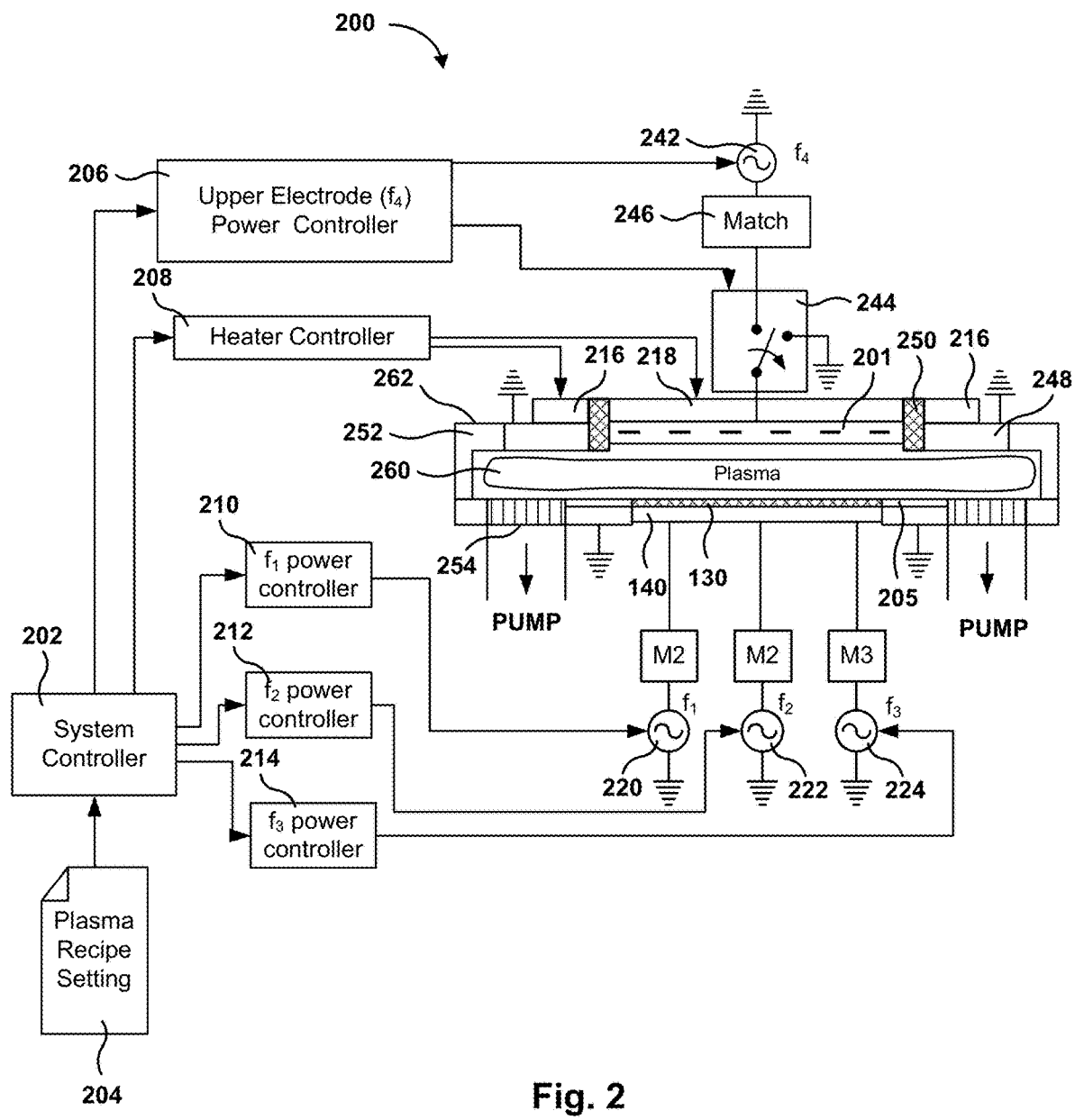
FIG. 2 is a plasma chamber, in accordance with embodiments of the present invention.

FIG. 2 is a plasma chamber 200, in accordance with embodiments of the present invention. The chamber of FIG. 2 includes RF power sources 220, 222, and 224 with RF frequencies $f_1$, $f_2$, $f_3$, respectively, which are connected to the bottom electrode 108 via the corresponding matching networks. The upper electrode 201 is connected to a fourth RF power source 242, having an RF frequency $f_4$, via switch 244 and matching network 246.

Further, the chamber includes a switch 244 that connects the upper electrode 201 to either ground potential or to RF power source 242 via matching network 246. A first heater 218 is situated above the upper electrode 201, and a second heater 216 is situated above ground electrode 248. The heaters are isolated from the upper electrode 201 and the ground electrode by a layer of aluminum nitride material, although other insulators may also be utilized. Heater 216 controls the temperature in the outer area of the ground electrode, and heater 218 controls the temperature of the upper electrode 201. Each heater is operable to be turned on or turned off independently during a substrate processing operation.

Controlling the temperature of the upper electrode may be utilized to adjust the response of the chamber. However, controlling the temperature has the limitation that the temperature cannot be changed quickly. Therefore, temperature control provides a slow response to changes in the chamber. It is difficult to control each substrate-processing operation utilizing temperature control of the upper electrode 201. In addition, there is an upper limit to the temperature that can be applied to the silicon surfaces in the chamber 200.

The wafer processing apparatus further includes system controller 202, upper electrode power controller 206, heater controller 208, and power controllers 210, 212, and 214 for $f_1$, $f_2$, and $f_3$, respectively. System controller 202 receives a plasma recipe 204, which includes instructions for the different operations performed on the chamber. Processing of the wafer may be done in multiple operations, and each operation may require different settings in the chamber. For example, in one operation all four RF power sources are turned on, while in other operations only 3, or 2, or 1 RF power sources are turned on, etc.

Based on the recipe 204, the system controller sets the operational parameters of the chamber, including which RF power sources are turned on or turned off, their voltages and power settings, the setting of switch 244, the settings for heaters degrees 216 and 218, the gasses used in the chamber, the pressure on the chamber, the duration of the wafer-processing operation, etc. In one embodiment, the system controller 202 sends instructions to upper electrode power controller 206 for the configuration of the power on the top electrode, which includes setting switch 244 to connect the top electrode to ground or to RF power, and turning on or off RF power 242, as well as setting the power level for RF power 242.

System controller 202 interfaces with heater controller 208 to regulate the temperature of the upper electrode 201. Heater controller 208 regulates heaters 216 and 218 to control the temperature of the upper electrode 201. A temperature sensor (not shown) provides information to heater controller 208 on the temperature of the upper electrode 201 in one or more points of the upper electrode. Therefore, heater controller 208 may regulate the temperature on the upper electrode 201 by turning on or off the heaters to achieve a desired temperature during wafer processing.

System controller also 202 interfaces with power controllers 210, 212, and 214, which regulate whether the corresponding RF power 210, 222, or 224, is turned on or off, and if the power is turned on, to what power setting. In one embodiment, the frequency of RF power source 242 is 400 kHz. In another embodiment, the frequency is in the range from 400 kHz to 2 MHz, while in yet another embodiment the frequency is in the range from 100 kHz to 10 MHz. In some operations, the three bottom RF powers are not turned on simultaneously, which allows having a higher frequency at the top RF. In one embodiment, $f_4$ is different from the frequencies at the bottom $f_1$-$f_3$ in order to avoid resonance on the chamber.

In one embodiment, the pressure in the chamber has a value between 20 mTorr and 60 mTorr. In another embodiment, the voltage of the top power source can be in the range of hundreds of volts (e.g., 100 V to 2000 V or more), and the bottom RF power sources can have a voltage up to 6000 V or more. In one embodiment, the voltage is 1000 V. In another embodiment, the voltage of the top RF power source has a value between 100 V and 600 V, and the voltage of the bottom RF power sources has a value between 1000 V and 6000 V. The pressure in the top chamber and the bottom chamber can have a value between 10 mTorr and 500 mTorr. In one embodiment, the chamber operates at a pressure of 15 mTorr.

It is noted that the embodiment illustrated in FIG. 2 is exemplary. Other embodiments may utilize different types of chambers, different frequencies, other types of adjustments for the chamber configuration based on the recipe, different pressures in the chamber, etc. For example, in one embodiment, the chamber is a CCP plasma chamber. Furthermore, some of the modules described above in the semiconductor wafer processing apparatus may be combined into a single module, or the functionality of a single module may be performed by a plurality of modules. For example, in one embodiment, power controllers 210, 212, and 214 are integrated within system controller 202, although other configurations are also possible. The embodiment illustrated in FIG. 2 should therefore not be interpreted to be exclusive or limiting, but rather exemplary or illustrative.

Dual Temperature Zone Upper Electrode

Figure 3A:
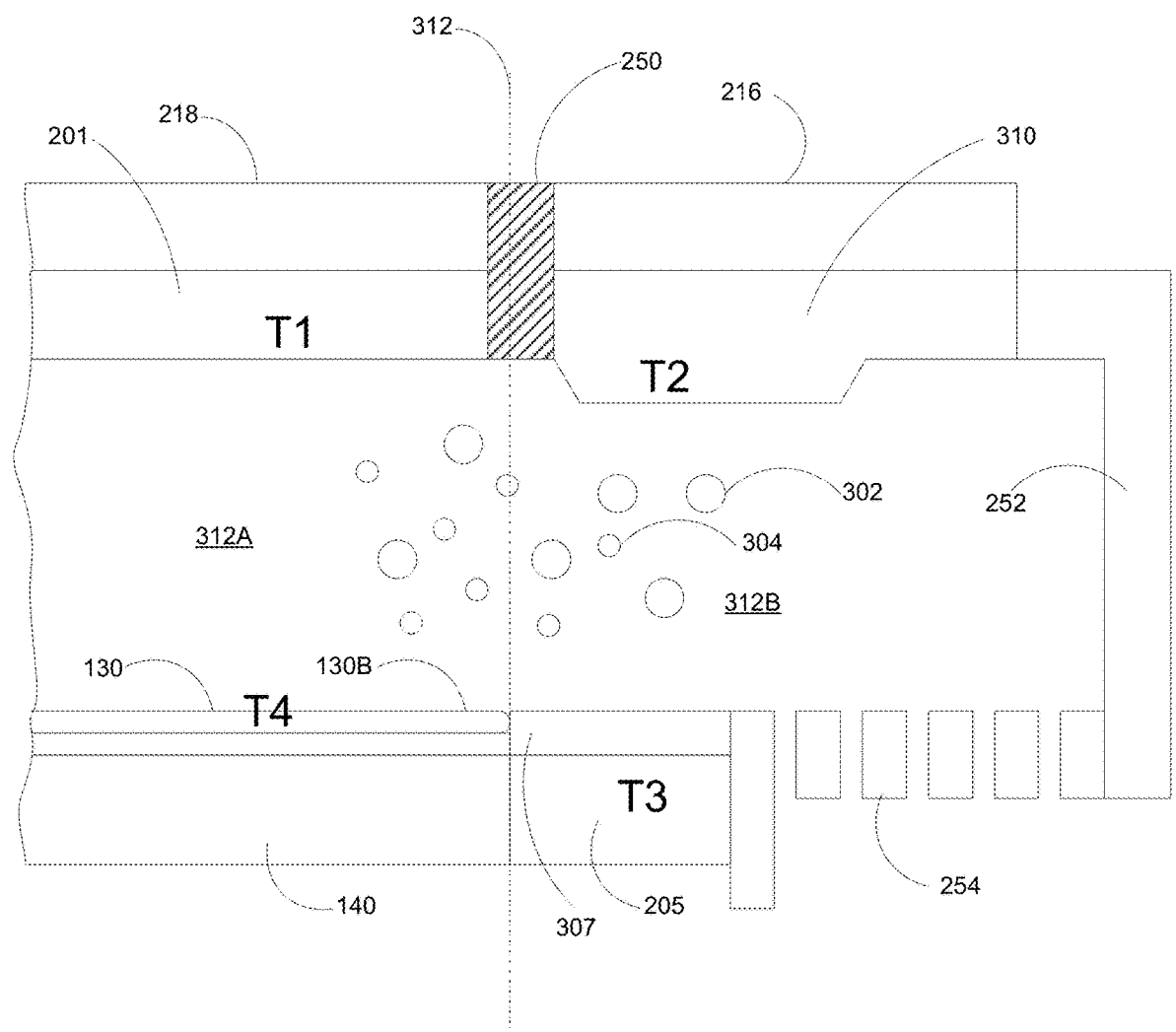
FIG. 3A is a schematic diagram of the edge region of the plasma chamber in accordance with embodiments of the present invention.

FIG. 3A is a schematic diagram of the edge region of the plasma 200 chamber in accordance with embodiments of the present invention. The upper electrode 201 is thermally coupled to an inner heater 218 over regions 312A over the substrate edge region 130B. A plasma confinement structure 252 extends outward beyond the substrate edge region 130B. The confinement structure 252 includes multiple confinement rings 254.

The substrate support 140 includes an edge ring 205. The edge ring 205 includes an edge ring temperature control mechanism capable of heating or cooling the edge ring to a desired edge ring temperature. The edge ring 205 is adjacent to and outside the substrate edge region 130B. The edge ring 205 is electrically isolated from the plasma by an edge ring 307.

The confinement structure 252 also includes a protrusion 310 that protrudes downward from the upper portion of the plasma chamber. The protrusion 310 is thermally coupled to an outer heater 216.

An insulator 250 electrically and thermally insulates the upper electrode 201 from the protrusion 310 and the inner heater 218 from the outer heater 216. The inner heater 218 can heat the upper electrode 201 to a first desired temperature T1 (i.e., an inner electrode temperature). The outer heater 216 can heat the protrusion 310 to a second desired temperature T2 (i.e., an outer electrode temperature). Similarly, the edge ring 205 can be heated to a third desired temperature T3 (i.e., an edge ring temperature). The substrate 130 can be heated to a fourth desired temperature T4 (i.e., a substrate temperature).

Densities of neutral molecules 302 and ions 304 in inner region 312A and outer region 312B can be selected by the relative temperatures T1, T2, T3 and T4. The neutral molecules 302 tend to buffer the reactivity between the etched surface and the ions 304. The neutral molecules 302 tend to diffuse in the thermal gradient and attach to the coldest surface of the relative temperatures T1, T2, T3 and T4. The relative densities of neutral molecules 302 and ions 304 can manipulated be to select etch rate.

By way of example, if T1>T2, then the relative density of the neutral molecules 302 can be increased in the inner plasma region 312A over the edge 130B of the substrate 130 as compared to outer plasma region 312B. Thus decreasing the reactivity of the ions 304 over the edge 130B of the substrate 130. This decreased reactivity of the ions 304 results in a correspondingly reduced etch rate of the edge region 130B of the substrate 130.

Similarly, if T2>T1, then the relative density of the neutral molecules 302 can be decreased in the inner plasma region 312A over the edge 130B of the substrate 130 as compared to outer plasma region 312B. Thus increasing the reactivity of the ions 304 over the edge 130B of the substrate 130. This increased reactivity of the ions 304 results in a correspondingly increased etch rate of the edge region 130B of the substrate 130.

By thus selecting the relative temperatures in the respective plasma regions 312A, 312B, the corresponding etch rate can be increased or decreased at the edge region 130B of the substrate 130.

Figure 3B:
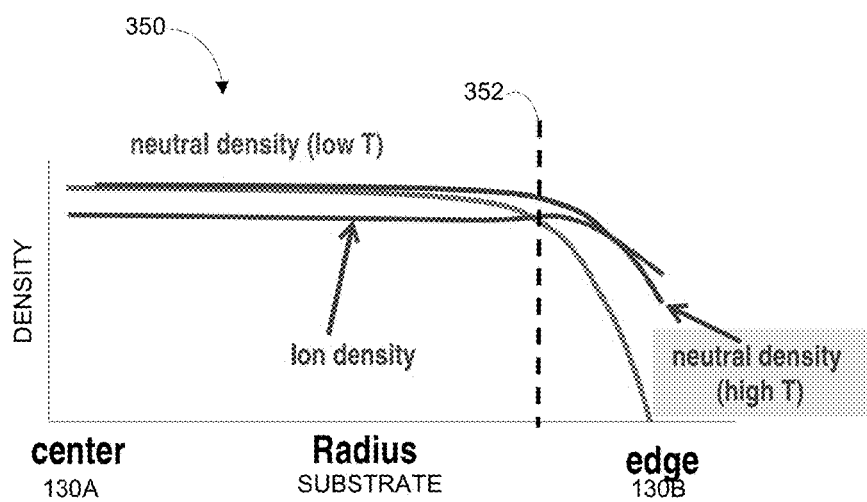
FIG. 3B is a graph of the density of the ions and neutrals, in accordance with embodiments of the present invention.

FIG. 3B is a graph 350 of the density of the ions 304 and neutrals 302, in accordance with embodiments of the present invention. The graph 350 has the radius of the substrate on the horizontal axis and the relative density of the ions 304 and neutrals 302 is shown on the vertical axis.

Figure 3C:
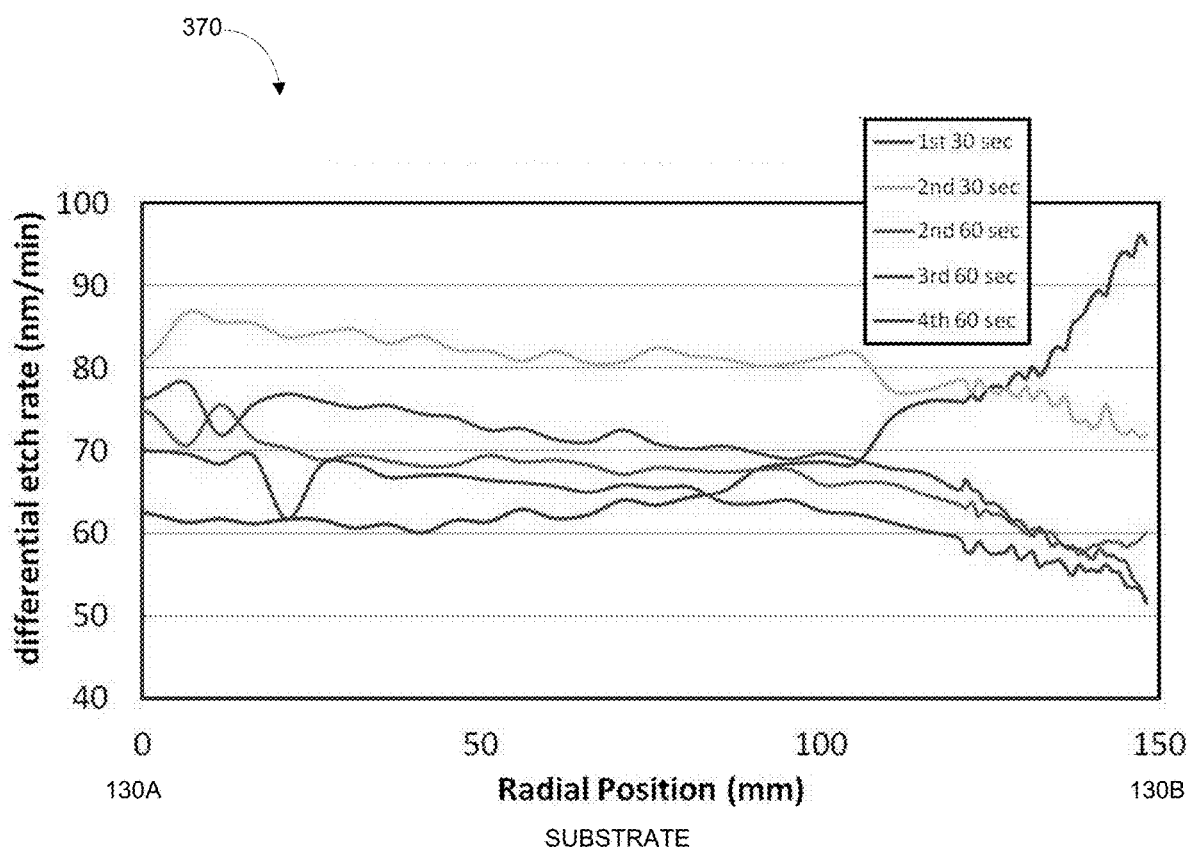
FIG. 3C is a graph of the relative etch rates across the radius of the substrate, in accordance with embodiments of the present invention.

FIG. 3C is a graph 370 of the relative etch rates across the radius of the substrate 130, in accordance with embodiments of the present invention. The graph 370 has the radius of the substrate on the horizontal axis and the etch rate is shown on the vertical axis of multiple etch iterations.

In the center region 130A of the substrate 130, the relative densities of the ions 304 and neutrals 302 are proximately equal and the corresponding etch rate is approximately equal in that same portion of the substrate.

Toward the edge region 130B of the substrate 130, the relative densities tend to vary at a drop-off line 352. Manipulating the relative temperatures T1, T2, T3, as described above, can move the drop-off line 352 left or right on the graph. Ideally, manipulating the relative temperatures T1, T2, T3, as described above, can move the drop-off line 352 to the right beyond the edge 130B of the substrate 130.

Figure 3D:
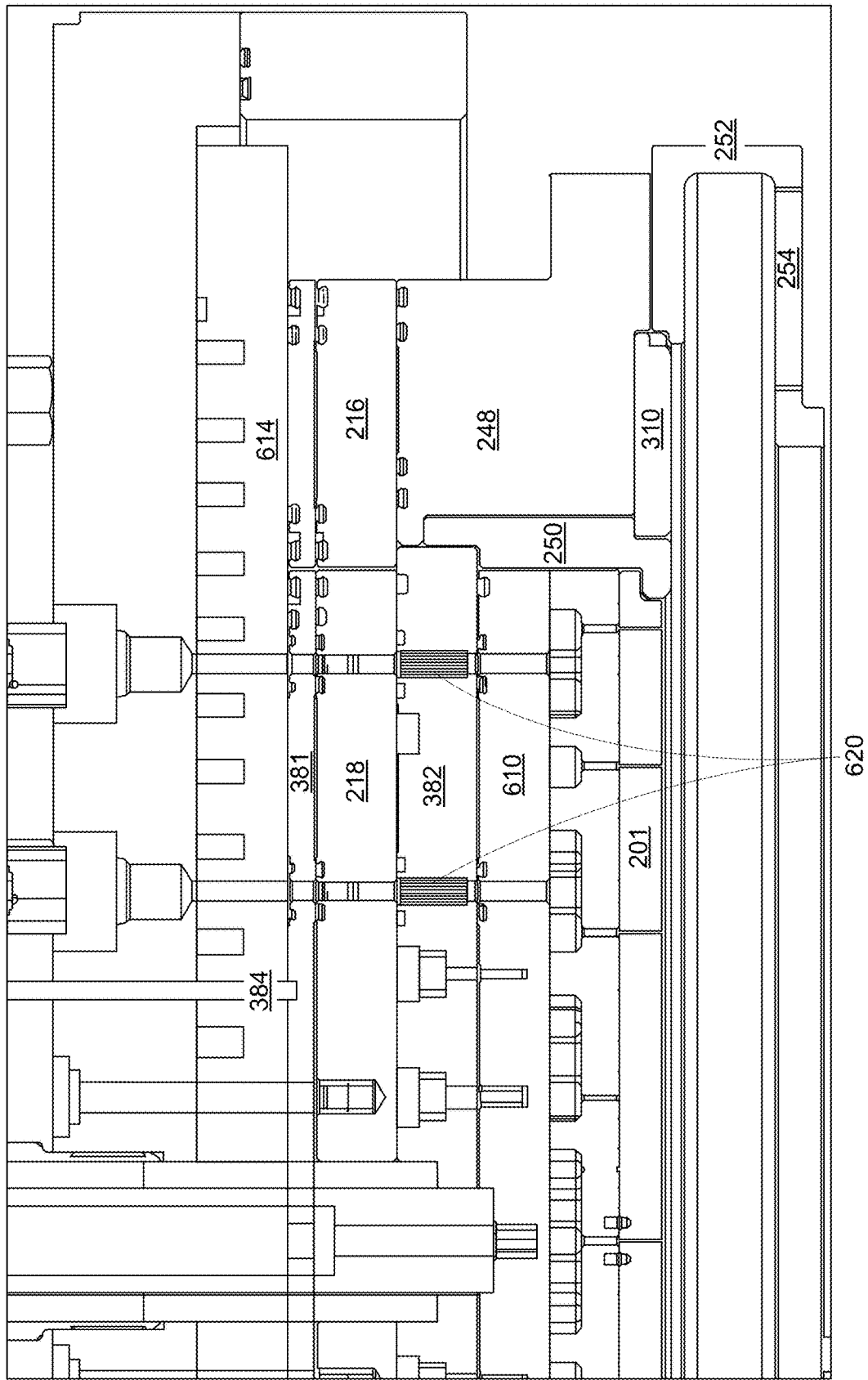
FIG. 3D is a schematic diagram of a portion of the plasma chamber top, in accordance with embodiments of the present invention.

FIG. 3D is a schematic diagram of a portion of the plasma chamber top, in accordance with embodiments of the present invention. The inner heater 218, outer heater 216, ground electrode 248, gas distribution plate 610 and in insulator plate 382 (i.e., aluminum nitride or other suitable insulator). The gas distribution plate 610 can have an RF signal applied and thus typical thermo couples need filter networks to function effectively. Thus an optical temperature sensor 384 can be used to monitor the temperature of the gas distribution plate 610.

It should be understood that the optical temperature sensor 384 can be placed in any orientation and location that provides a suitable optical view of the gas distribution plate 610. The optical temperature sensor 384 can monitor the temperature of the gas distribution plate through the insulator plate 382. The ground electrode 248 can also include a plate heater.

The inner heater 218, the outer heater 216, the heated edge ring 205 and the heating and cooling systems within the electrostatic chuck 140 can be used individually and in combination to reduce the thermal ramp up time in the plasma chamber. The inner heater 218, the outer heater 216, the heated edge ring 205 and the heating and cooling systems within the electrostatic chuck 140 can also be used individually and in combination to minimize and even substantially eliminate interim, partial cooling that typically occurs during plasma processing in various portions of the plasma chamber. Reducing or eliminating interim, partial cooling improves the processing speed and maintains the plasma chamber at a more constant temperature over time and over the desired surfaces in the plasma chamber. Reducing or eliminating interim, partial cooling improves the consistency of the chemical processes as hot and cool spots and intervals can effect the partial pressures of the various gases and plasma by products present in the chamber.

FIG. 4A is a flowchart diagram that illustrates the method operations 400 performed in selecting an edge etch rate using a dual temperature zone upper electrode, in accordance with one embodiment of the present invention. The operations illustrated herein are by way of example, as it should be understood that some operations may have sub-operations and in other instances, certain operations described herein may not be included in the illustrated operations. With this in mind, the method and operations 400 will now be described.

In operation 405 a plasma 260 is created in the plasma chamber 262. In an operation 410 an inquiry is made to determine whether to reduce the etch rate over the edge region 130B. If the edge region 130B etch rate is to be reduced then the method operations continue in an operation 415. If the edge region 130B etch rate is not to be reduced then the method operations continue in an operation 420.

In operation 415 temperature T1 and/or T4 is adjusted to be greater than temperature T2 and T3, and the method operations continue in an operation 430.

In operation 420, an inquiry is made to determine whether to increase the etch rate over the edge region 130B. If the edge region 130B etch rate is to be increased then the method operations continue in operation 425. If the edge region 130B etch rate is not to be increased then the method operations continues in operation 430.

In operation 420 temperature T2 and/or T3 is adjusted to be greater than temperature T1 and T4, and the method operations continue in operation 430.

In operation 430, an inquiry is made to determine whether to the etch processing is complete. If the etch processing is complete then the method operations can end. If the etch processing is not complete then the method operations continue in operation 410 as described above.

Another aspect of having a dual zone temperature control of the upper electrode 201 is when the upper electrode has RF applied then heat will be generated in the upper electrode and then cool when the RF is not applied. The heaters 218, 216 provide dual zone temperature control the upper electrode 201 allows the central portion of the upper electrode 201 to be cooled when the RF is applied and heated the RF is not applied so as to maintain a desired set point temperature.

Another aspect of this invention is that the dual zone temperature control upper electrode can have the nonconductive surface 201A of the upper electrode 201 removable from the remainder of the electrode 201 for servicing (e.g., cleaning).

FIG. 4B is a flowchart diagram that illustrates the method operations 450 performed in maintaining a set point temperature of the upper electrode 201, in accordance with one embodiment of the present invention. The operations illustrated herein are by way of example, as it should be understood that some operations may have sub-operations and in other instances, certain operations described herein may not be included in the illustrated operations. With this in mind, the method and operations 450 will now be described.

In operation 452, a plasma 260 is created in the plasma chamber 262. In an operation 454 an inquiry is made to determine whether RF is applied to the upper electrode 201. If RF is applied to the upper electrode 201, then the method operations continue in an operation 456. If RF is not applied to the upper electrode 201, then the method operations continue in an operation 458.

In operation 456, temperature T1 is reduced to maintain a set point temperature and the method operations continue in an operation 460. In operation 458, temperature T1 is increased to maintain a set point temperature and the method operations continue in operation 460.

In operation 460, an inquiry is made to determine whether to the etch processing is complete. If the etch processing is complete then the method operations can end. If the etch processing is not complete then the method operations continue in operation 454 as described above.

Multi Zone Gas Injection Upper Electrode

Another approach to manipulate the etch rate from the center 130A to edge 130B of the substrate 130 is to adjust the process gas concentrations radially from the center to edge of the substrate. The multi zone gas injection from the upper electrode 501 allows a tuning gas (e.g., oxygen or other tuning gas) to be injected in different zones radially outward from the center of the substrate 130. The tuning gas changes the carbon/fluorine ratio at the surface of the substrate 130 and thus changes the ion density and the corresponding etch rate.

The exemplary embodiment described herein includes three gas injections zones in the upper electrode 501 however it should be understood that more than three zones could also be used (e.g., four or more zones).

Figure 5A:
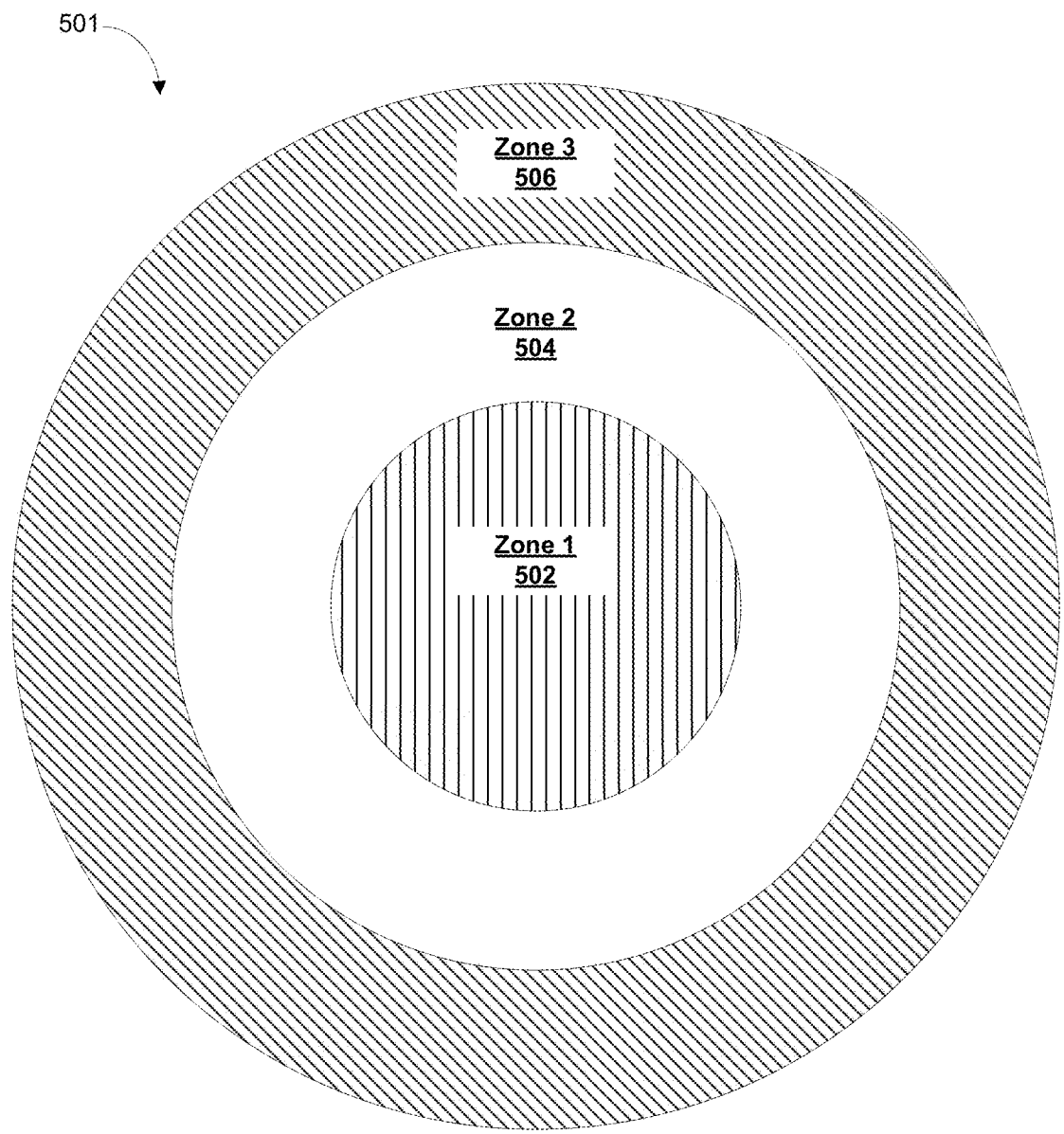
FIGS. 5A and 5B are schematic diagrams of multi zone gas injection upper electrode, in accordance with embodiments of the present invention.
Figure 5B:
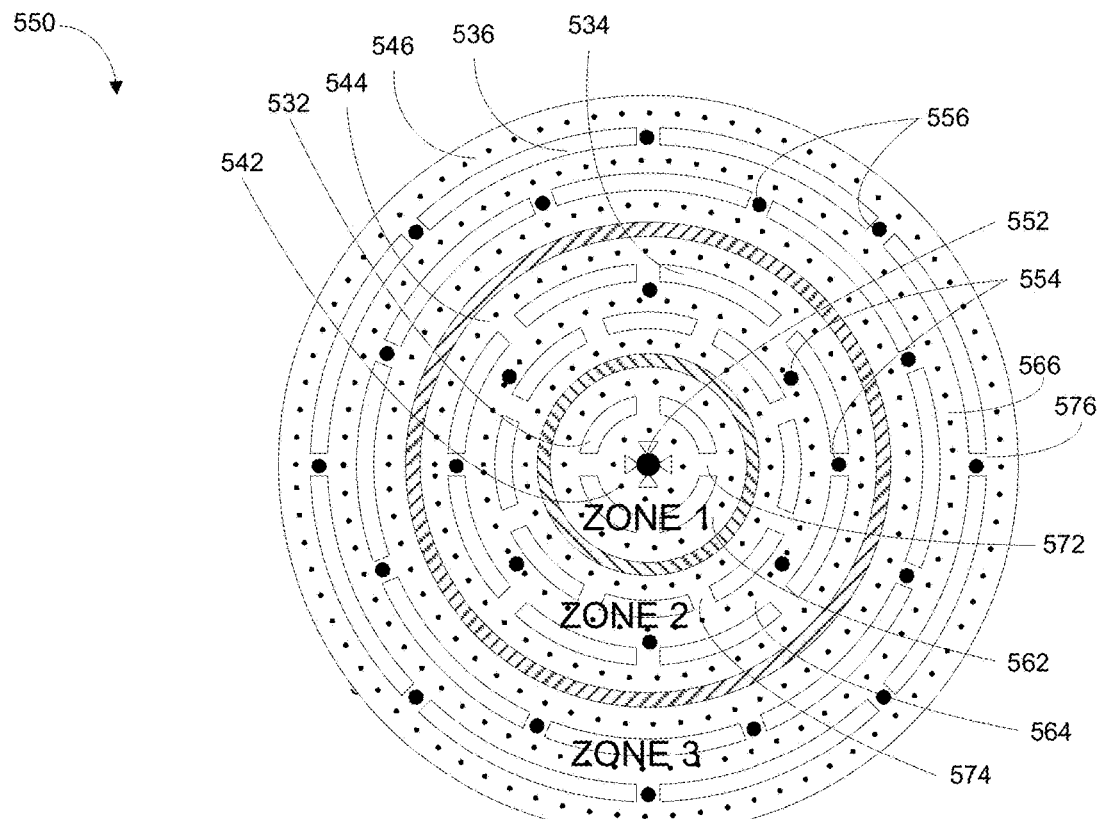

FIGS. 5A and 5B are schematic diagrams 500, 550 of multi zone gas injection upper electrode 501, in accordance with embodiments of the present invention. The multi zone gas injection upper electrode 501 includes three gas injection zones 502, 504 and 506. A gas injection zones 502, 504 and 506 are concentric.

The central gas injection zone 1, 502 has a central gas supply feed 552. Each of the concentric gas injection zones 504, 506 has respective gas supply feeds that are substantially evenly distributed around the respective circumference. By way of example, gas injection zone 2 504 has four gas supply feeds 554 which are in turn supplied by a central and spoke distribution manifold. Similarly, gas injection zone 3 506 has eight gas supply feeds 556 which are in turn supplied by a central and spoke distribution manifold.

The evenly distributed gas supply feeds 554, 556 can be aligned in their respective gas injection zone 504, 506. Alternatively, the evenly distributed gas supply feeds 554, 556 can be offset (i.e., clocked) in their respective gas injections zone 504, 506. The number of distributed gas supply feeds 554, 556 can be the same in each zone 504, 506 or different numbers in each zone.

Each of the gas injection zones 502, 504, 506 can include one or more concentric gas plenum rings 562, 564, 566. The gas plenum rings 562, 564, 566 are coupled in together by multiple gas channels 572, 574, 576 within their respective gas injection zones 502, 504, 506. Each of the gas injection zones 502, 504, 506 include multiple outlet ports 532, 534, 536 through the surface of the upper electrode and into the plasma zone.

Figure 5C:
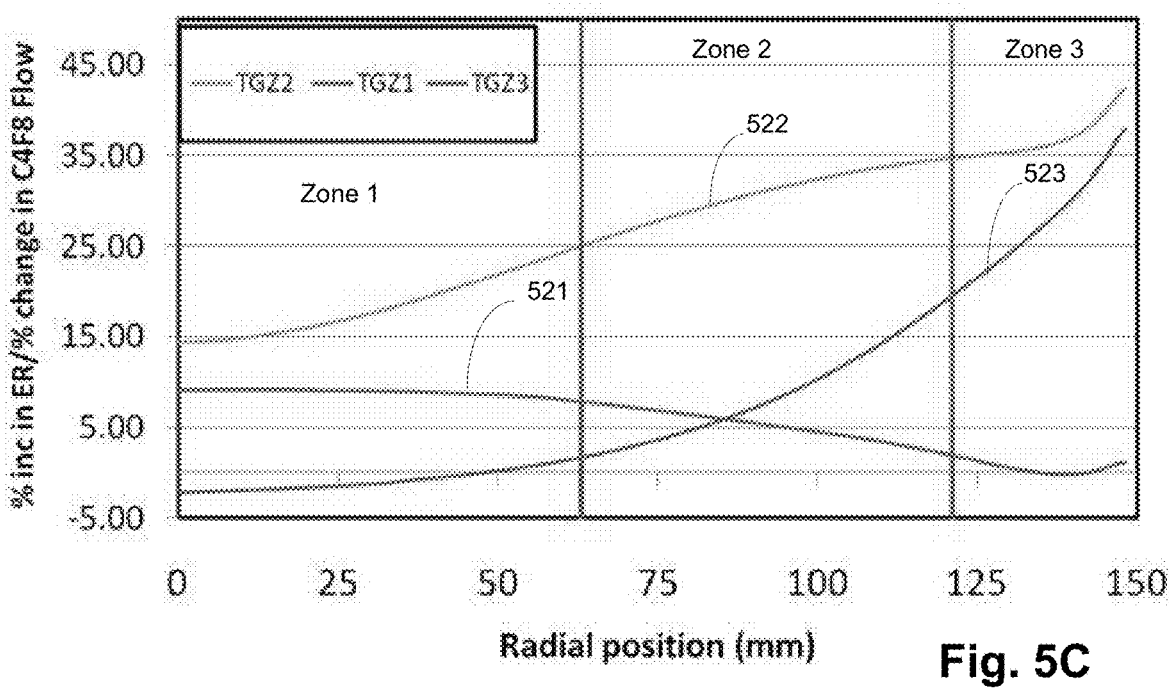
FIG. 5C is a graph of the effectiveness of tuning gas injections in each of the gas injection zones, in accordance with embodiments of the present invention.

FIG. 5C is a graph 520 of the effectiveness of tuning gas injections in each of the gas injection zones 502, 504, 506, in accordance with embodiments of the present invention. Graph 521 is the effectiveness of the tuning gas injected in the gas injections zone 1 502. Graph 522 is the effectiveness of the tuning gas injected in the gas injections zone 2 504. Graph 523 is the effectiveness of the tuning gas injected in the gas injections zone 3 506.

Referring to graph 521, the tuning gas injected in gas injection zone 1, 502 is more consistently effective (i.e., more linearly predictable) across gas injection zone 1 than in gas injection zone 2, 504 and zone 3 506. Referring to graph 522, the tuning gas injected in gas injection zone 2, 504 is more consistently effective across gas injection zone 2 than in gas injection zone 1, 502 or zone 3 506. Referring to graph 523, the tuning gas injected in gas injection zone 3, 506 is more consistently effective across gas injection zone 3 than in gas injection zone 1, 502 or zone 2 504.

Figure 5D:
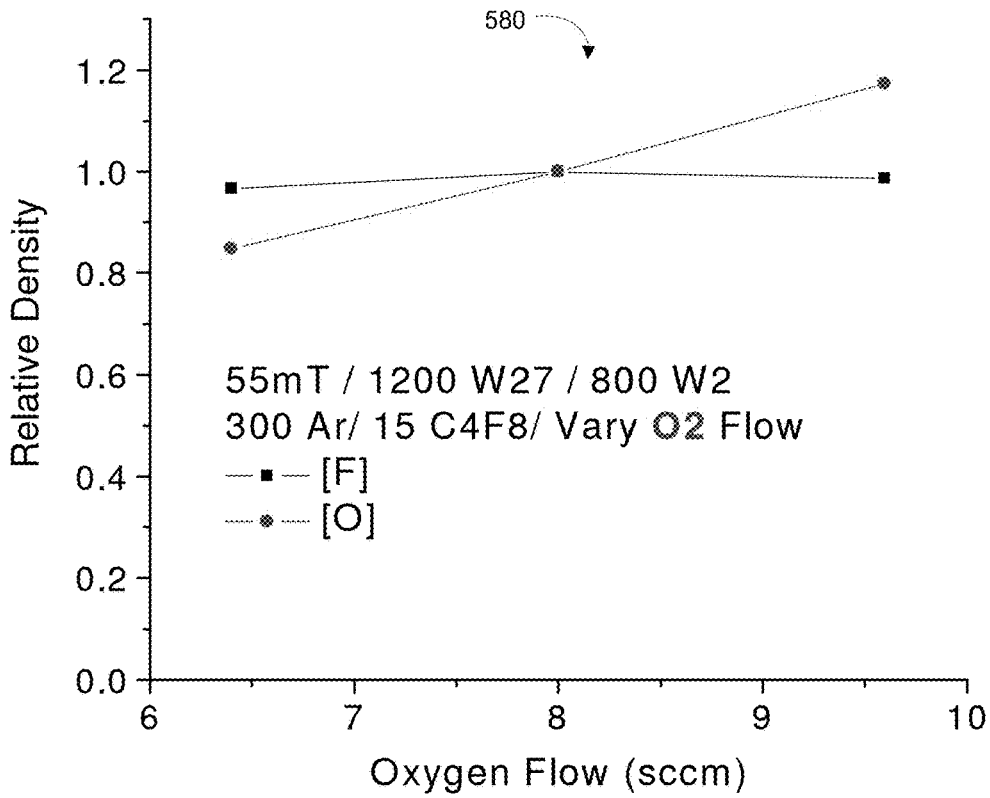
FIGS. 5D and 5E are graphs of the relative densities of the tuning gas and the process gas, in accordance with an embodiment of the present invention.
Figure 5E:
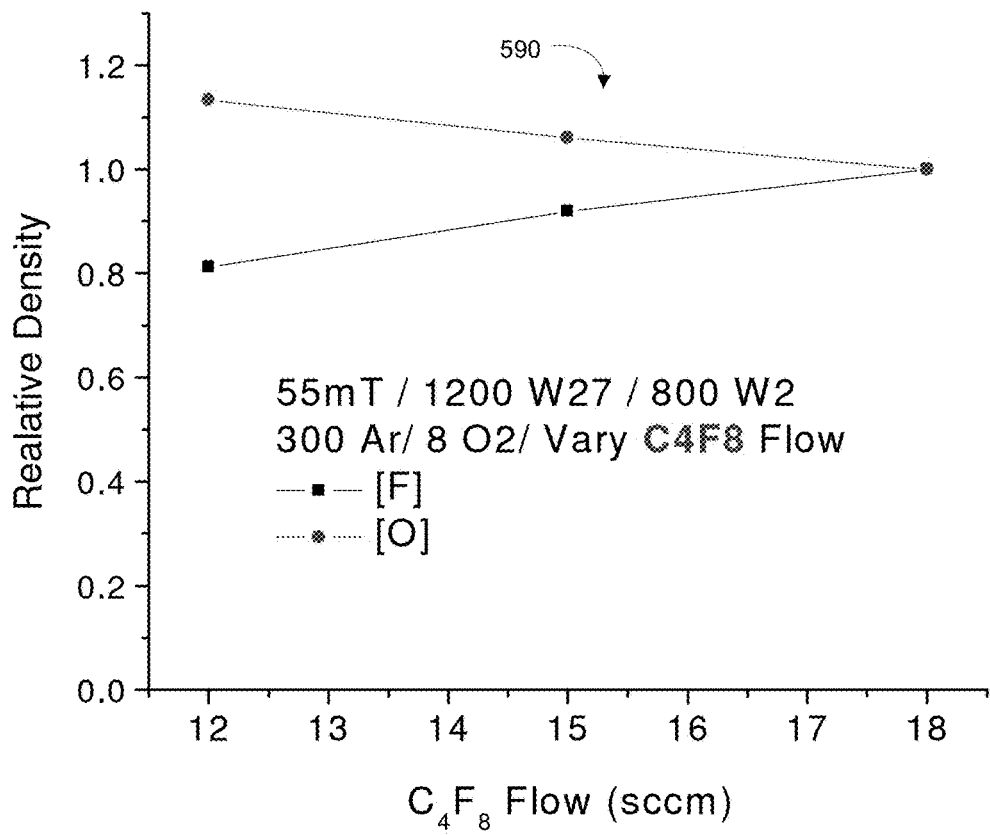

FIGS. 5D and 5E are graphs 580, 590 of the relative densities of the tuning gas and the process gas, in accordance with an embodiment of the present invention. Increasing the tuning gas (oxygen) flow rate increases the presence of oxygen radicals proportionally to the flow rate. While the process gas (Fluorine) density is substantially constant. Increasing the process gas (C4F8) flow rate decreases the relative density of the oxygen radical. The process gas radical (Fluorine) increases substantially proportionally to the process gas flow rate. The relative density of the oxygen radical controls the degree of polymer removal without changing the plasma properties. The relative density of the process gas impacts the effectiveness at lower residence times.

Figure 6:
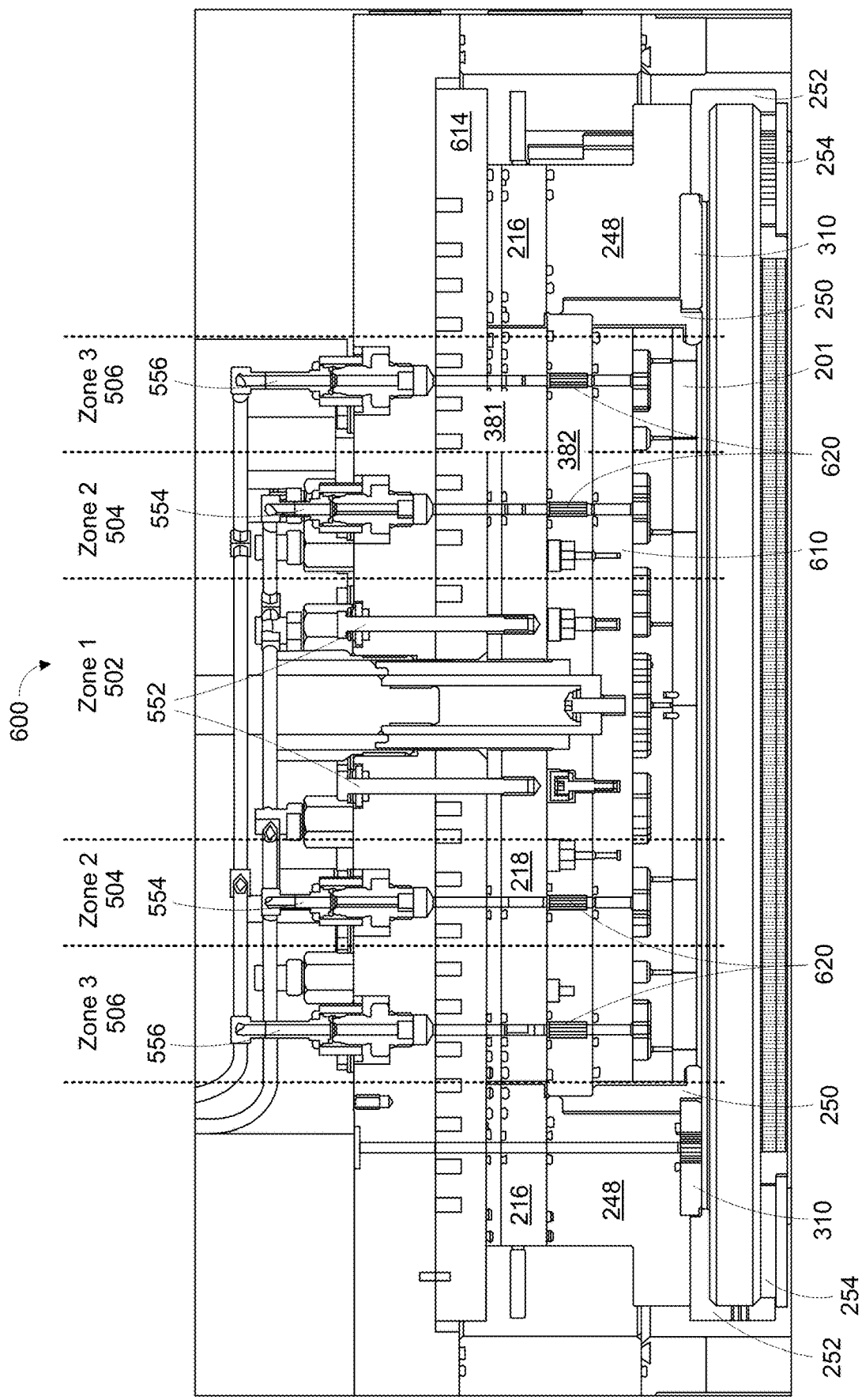
FIG. 6 is a cross-sectional view of a plasma chamber having the multi zone gas injection upper electrode, in accordance with embodiments of the present invention.

FIG. 6 is a cross-sectional view of a plasma chamber 600 having the multi zone gas injection upper electrode 501, in accordance with embodiments of the present invention. The cross-sectional view of a plasma chamber 600 illustrates the multi layer assembly forming the top portion of the plasma chamber. The multi zone gas injection upper electrode 501 includes an inner electrode 201 and an outer electrode 310. Insulator 250 separates the inner electrode 201 and the outer electrode 310. Insulator 250 can be quartz or some other suitable insulating material. The inner electrode 201 and the outer electrode 310 can have different signals applied. By way of example an RF signal can be applied to the inner electrode 201 and a ground or other DC potential can be applied to the outer electrode 310.

The inner electrode 201 is removably mounted on a gas distribution plate 610. The gas distribution plate 610 distributes the process gases and tuning gases across the upper electrode 501. The gas distribution plate 610 includes distribution plenums 562, 564, 566 and channels 572, 574, 576 for evenly distributing the process gases and tuning gases.

The gas distribution plate 610 is mounted on an insulator plate 612. The insulator plate 612 electrically isolates the inner electrode 201 from the other layers forming the top portion of the plasma chamber 600. The gas feeds 552, 554, 556 can include plasma arrestors 620. The plasma arrestors 620 prevent plasma from lighting in the gas feeds 552, 554, 556.

Figure 7A:
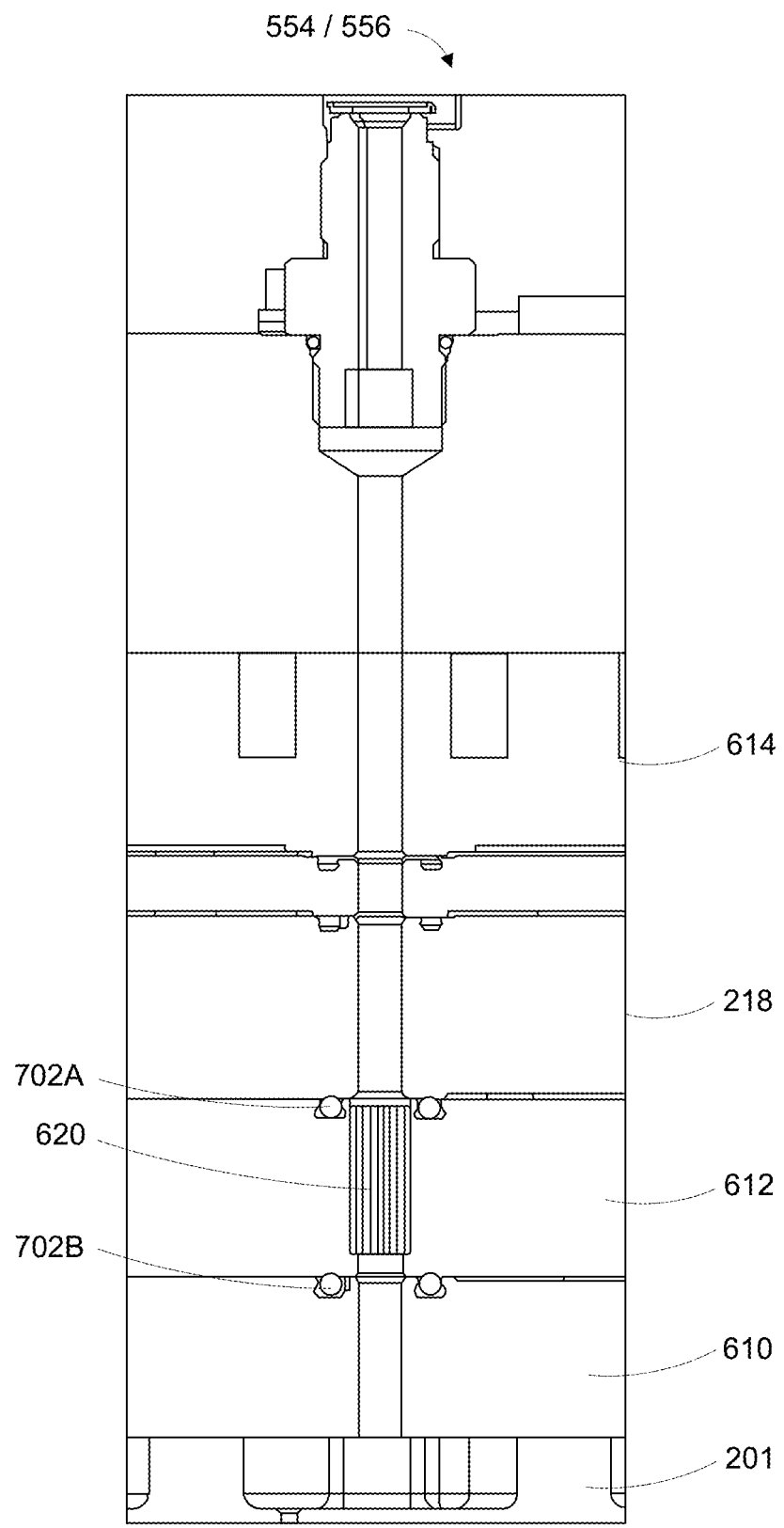
FIG. 7A is a schematic diagram of a distributed gas supply feed, in accordance with embodiments of the present invention.
Figure 7B:
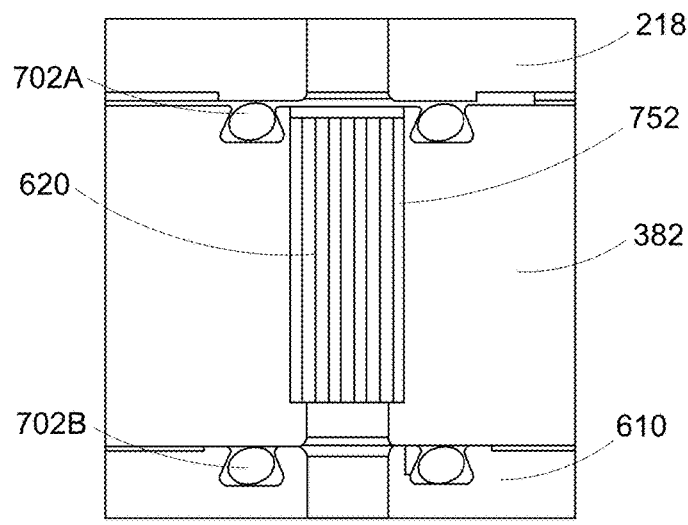
Figure 7C:
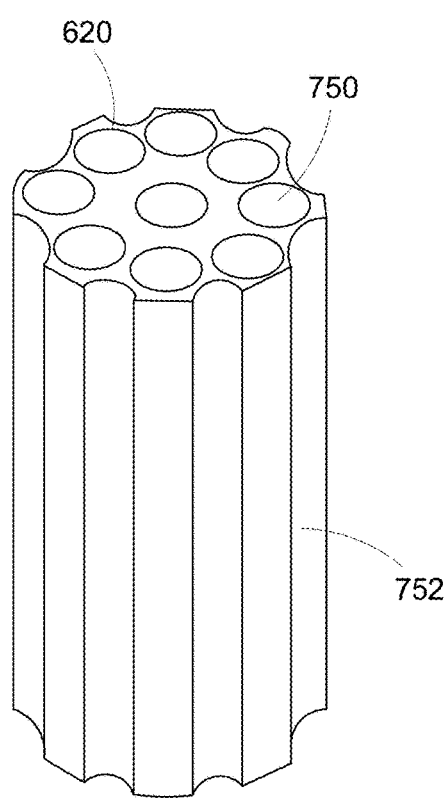
Figure 7D:
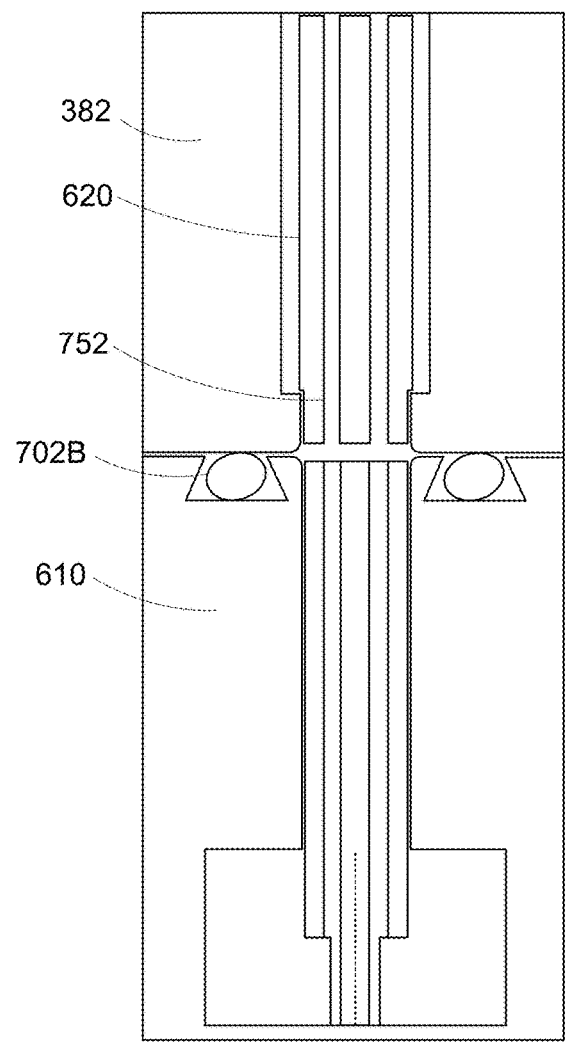

FIG. 7A is a schematic diagram of a distributed gas supply feed, 554, 556, in accordance with embodiments of the present invention. One or more of distributed gas supply feeds 554, 556 can include a plasma arrestor 620.

FIGS. 7B-F are schematic diagrams of plasma arrestors 620, 620', in accordance with embodiments of the present invention. The plasma arrestors 620, 620' substantially prevents plasma from igniting inside the distributed gas supply feed, 554, 556. Seals 702A, 702B prevent gas leakage.

The plasma arrestor 620 can include multiple small tubes 750 and fluted channels 752 along the exterior portion of the plasma arrestor. The small tubes 750 and the fluted channels 752 have a width small enough that it extinguishes any plasma that reaches the plasma arrestor 620. The plasma arrestor 620 can also include a grounding electrode (not shown) that can assist in extinguishing any plasma that reaches the plasma arrestor.

An alternative plasma arrestor 620' has a spiral outer coil 760 that forms a spiral channel having a width small enough that it extinguishes any plasma that reaches a plasma arrestor. The spiral outer coil 760 can also be grounded to assist in extinguishing the plasma that reaches the plasma arrestor 620'. The plasma arrestors 620, 620' can be made from a ceramic material (e.g., alumina or similar).

Figure 8:
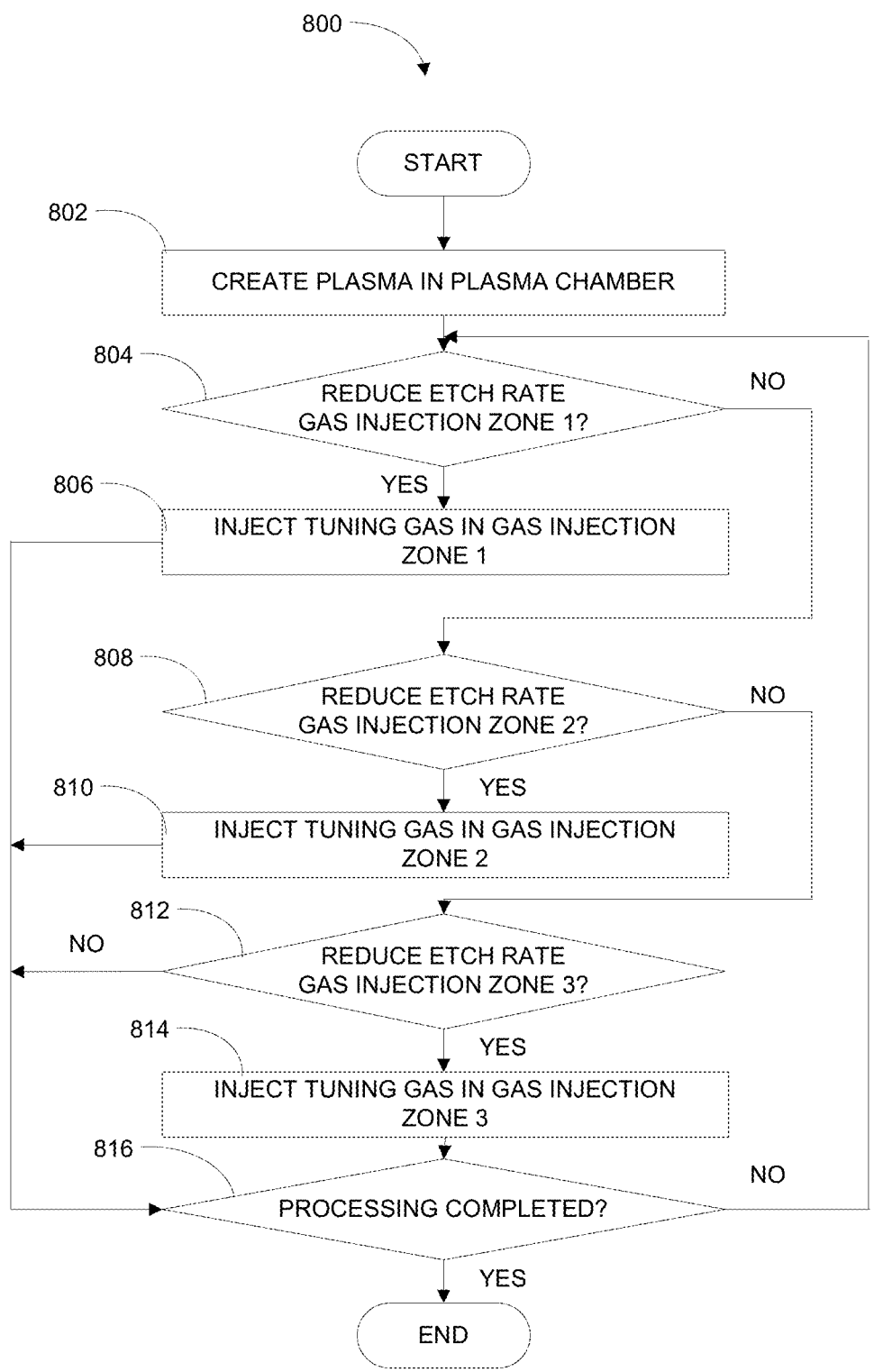
FIG. 8 is a flowchart diagram that illustrates the method operations performed in selecting an edge etch rate using distributed gas zones, in accordance with embodiments of the present invention.

FIG. 8 is a flowchart diagram that illustrates the method operations 800 performed in selecting an edge etch rate using distributed gas zones 502, 504, 506, in accordance with one embodiment of the present invention. The operations illustrated herein are by way of example, as it should be understood that some operations may have sub-operations and in other instances, certain operations described herein may not be included in the illustrated operations. With this in mind, the method and operations 800 will now be described.

In operation 802 a plasma 260 is created in the plasma chamber 262. In an operation 804 an inquiry is made to determine whether to reduce the etch rate over inner gas distribution zone 1, 502. If the inner gas distribution zone 1, 502 etch rate is to be reduced then the method operations continue in an operation 806. If the If the inner gas distribution zone 1, 502 etch rate is not to be reduced then the method operations continue in an operation 808.

In operation 806 tuning gas is injected into the inner gas distribution zone 1, 502, and the method operations continue in an operation 816.

In operation 808, an inquiry is made to determine whether to reduce the etch rate over mid gas distribution zone 2, 504. If the mid gas distribution zone 2, 504 etch rate is to be reduced then the method operations continue in an operation 810. If the mid gas distribution zone 2, 504 etch rate is not to be reduced then the method operations continue in an operation 812.

In operation 810 tuning gas is injected into the mid gas distribution zone 2, 504, and the method operations continue in an operation 816.

In operation 812, an inquiry is made to determine whether to reduce the etch rate over outer gas distribution zone 3, 506. If the outer gas distribution zone 3, 506 etch rate is to be reduced then the method operations continue in an operation 814. If the outer gas distribution zone 3, 506 etch rate is not to be reduced then the method operations continue in an operation 816.

In operation 812 tuning gas is injected into the outer gas distribution zone 3, 506, and the method operations continue in an operation 816.

In operation 816, an inquiry is made to determine whether to the etch processing is complete. If the etch processing is complete then the method operations can end. If the etch processing is not complete then the method operations continue in operation 804 as described above.

Figure 9:
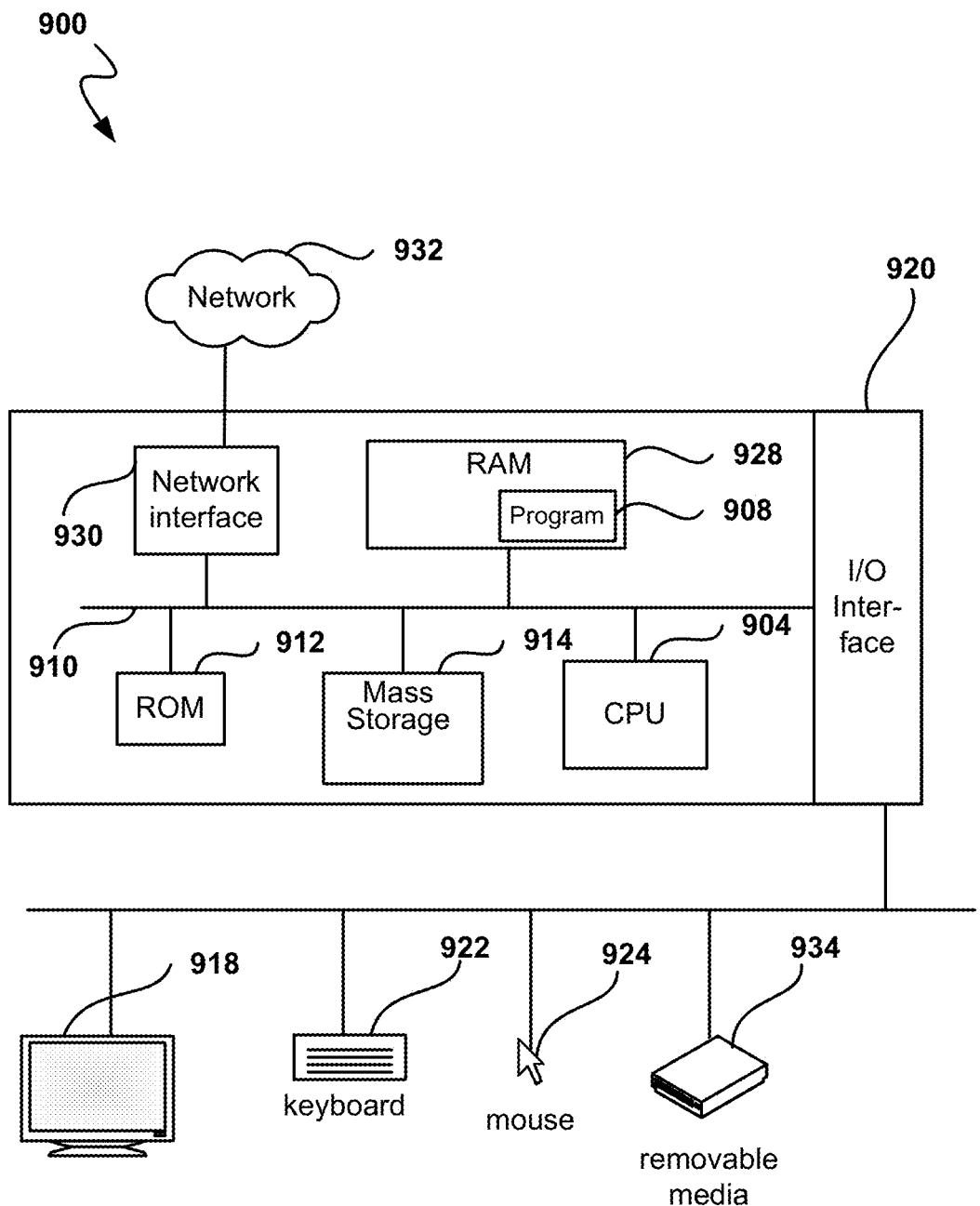
FIG. 9 is a simplified schematic diagram of a computer system in accordance with embodiments of the present invention.

FIG. 9 is a simplified schematic diagram of a computer system 900 in accordance with embodiments of the present invention. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 904, which is coupled through bus 910 to random access memory (RAM) 928, read-only memory (ROM) 912, and mass storage device 914. Phase control program 908 resides in random access memory (RAM) 928, but can also reside in mass storage 914 or ROM 912.

Mass storage device 914 represents a persistent data storage device such as a floppy disc drive or a fixed disc drive, which may be local or remote. Network interface 930 provides connections via network 932, allowing communications with other devices. It should be appreciated that CPU 904 may be embodied in a general-purpose processor, a special purpose processor, or a specially programmed logic device. Input/Output (I/O) interface provides communication with different peripherals and is connected with CPU 904, RAM 928, ROM 912, and mass storage device 914, through bus 910. Sample peripherals include display 918, keyboard 922, cursor control 924, removable media device 934, etc.

Display 918 is configured to display the user interfaces described herein. Keyboard 922, cursor control 924, removable media device 934, and other peripherals are coupled to I/O interface 920 in order to communicate information in command selections to CPU 904. It should be appreciated that data to and from external devices may be communicated through I/O interface 920. The embodiments can also be practiced in distributed computing environments where tasks are performed by remote processing devices that are linked through a wire-based or wireless network.

Figure 10A:
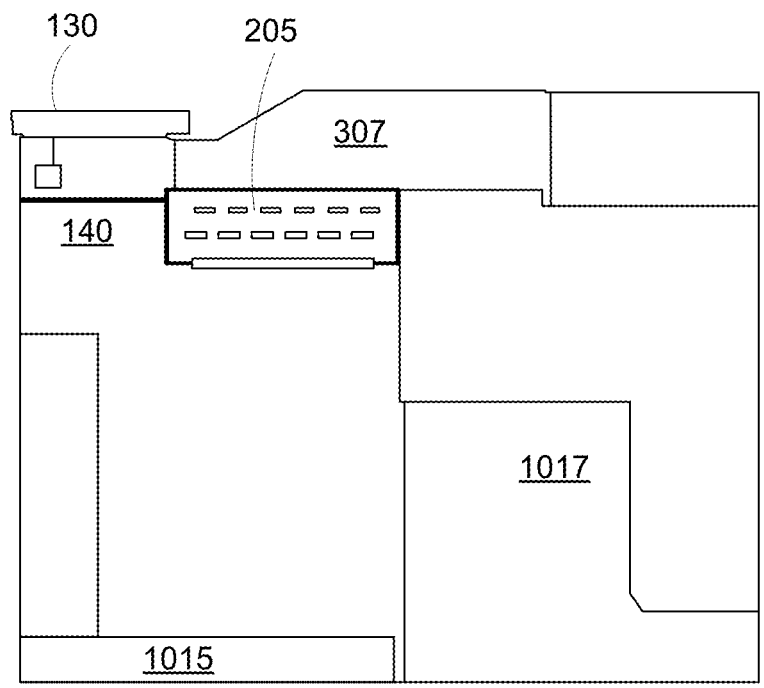
FIG. 10A is a schematic diagram of the heated edge ring, in accordance with embodiments of the present invention.

FIG. 10A is a schematic diagram of the heated edge ring 307, in accordance with embodiments of the present invention. A heater 205 can optionally be included to heat the edge ring 307.

Figure 10B:
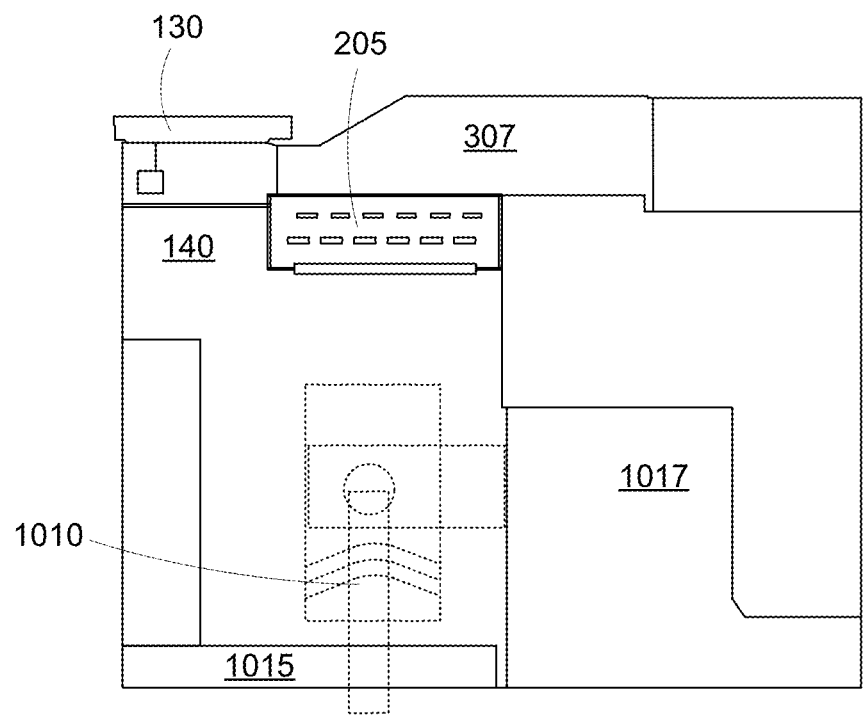
FIGS. 10B and 10C are schematic diagrams of a cam lock, in accordance with embodiments of the present invention.
Figure 10C:
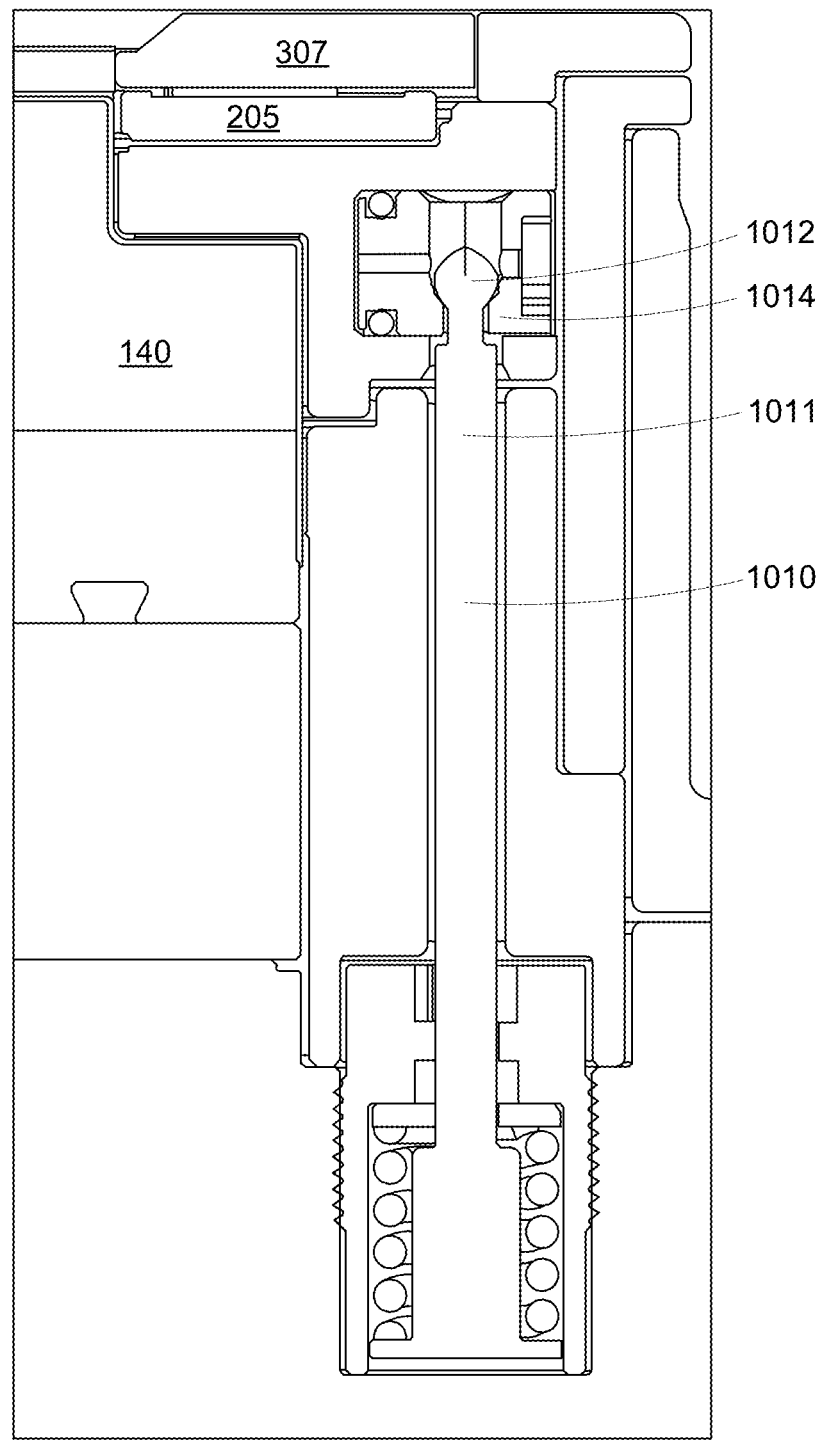

FIGS. 10B and 10C are schematic diagrams of a cam lock 1010, in accordance with embodiments of the present invention. The cam lock 1010 includes a cam lock shaft 1011 and a cam lock head 1012. The cam lock 1010 couples with a latch 1014 to secure the electrostatic chuck 140 to the facilities plate 1015.

Figure 10E:
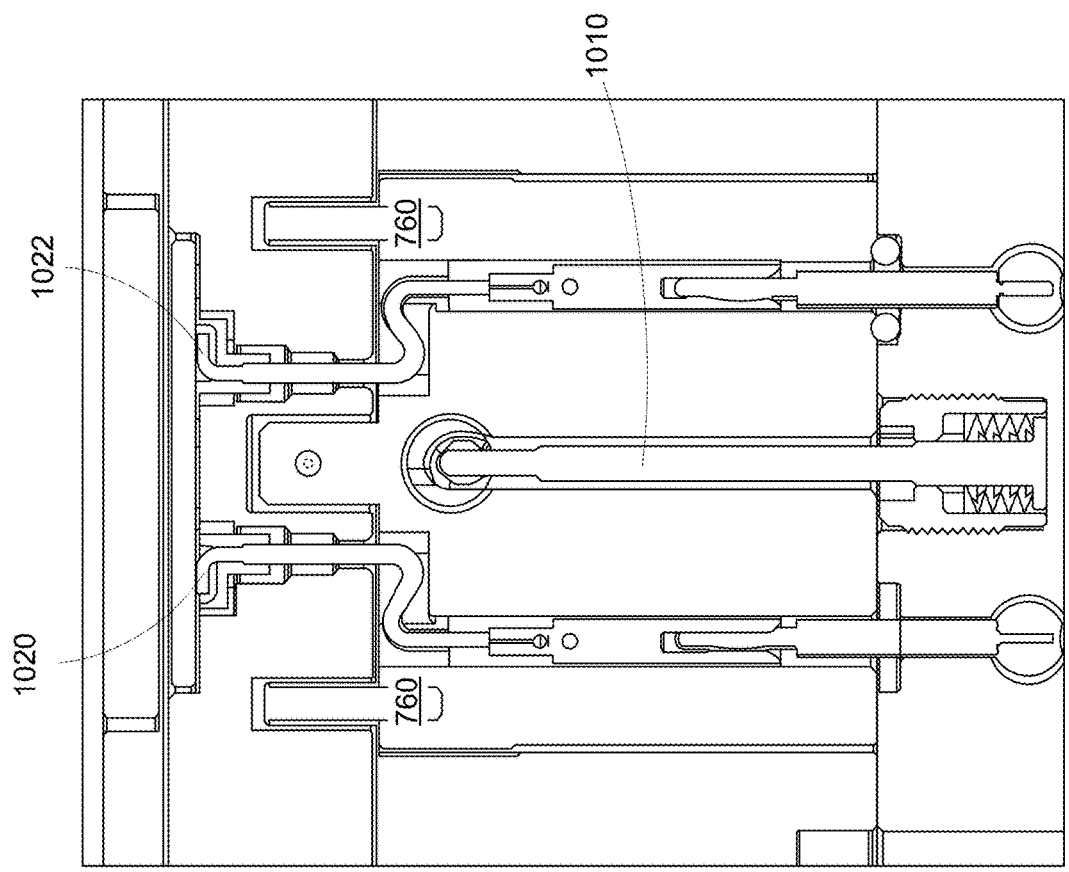
FIGS. 10D and 10E are schematic diagrams of electrical connections to the heaters, in accordance with embodiments of the present invention.
Figure 10D:
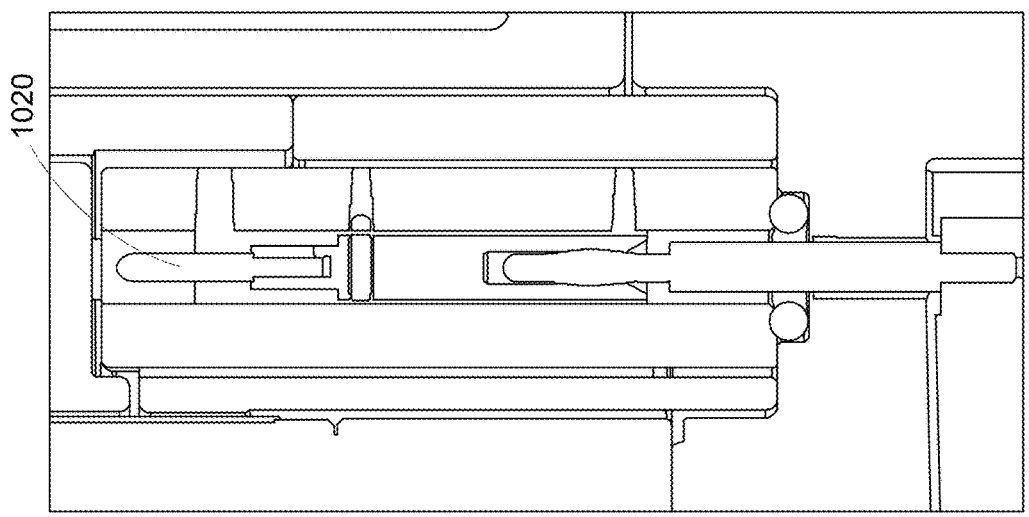

FIGS. 10D and 10E are schematic diagrams of electrical connections 1020, 1022 to the heaters 205, in accordance with embodiments of the present invention. The electrical connections 1020, 1022 couple electrical power to the heaters 205. The electrical connections 1020, 1022 are coupled to the heaters 205 when the cam locks 1010 secure the electrostatic chuck 140 to the facilities plate 1015.

Figure 10F:
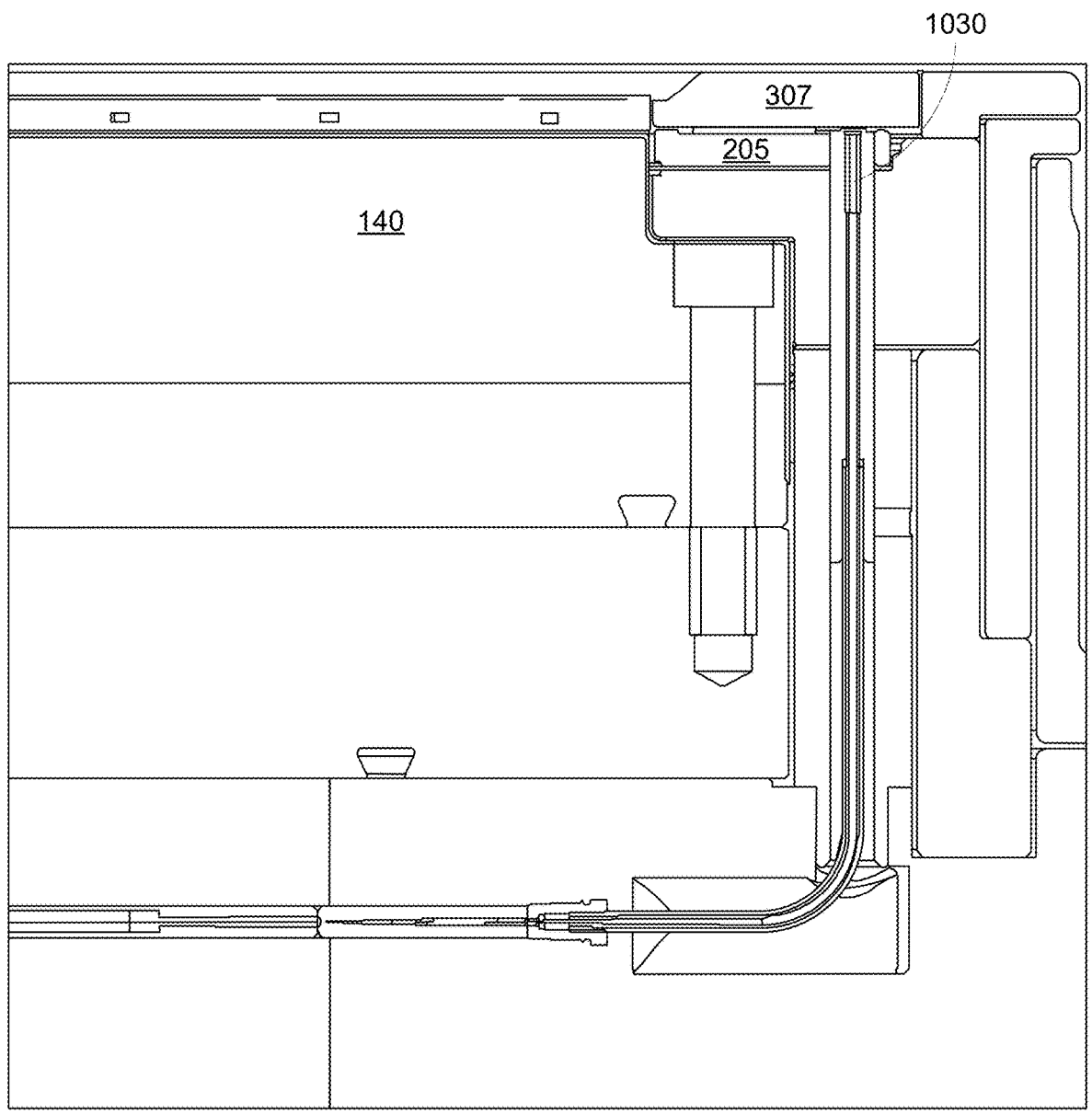
FIG. 10F is a schematic diagram of an optical temperature sensor, in accordance with embodiments of the present invention.

FIG. 10F is a schematic diagram of an optical temperature sensor 1030, in accordance with embodiments of the present invention. The optical temperature sensor 1030 monitors the temperature of the edge ring 307 and couples this temperature data to the system controller.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing system comprising:
a plasma chamber including:
a substrate support; and
a multi-zone gas injection upper electrode disposed opposite the substrate support, an inner plasma region being defined between the multi-zone gas injection upper electrode and the substrate support, the multi-zone gas injection upper electrode including an inner electrode, an outer electrode that surrounds the inner electrode, and an insulator that separates the inner electrode and the outer electrode, the multi-zone gas injection upper electrode including a gas distribution plate that is surrounded by the insulator and includes an insulator plate disposed over said gas distribution plate, the gas distribution plate being disposed between the insulator plate and the inner electrode, the multi-zone gas injection upper electrode including an inner heater and an outer heater, the inner heater being disposed above the insulator plate, the gas distribution plate, and the inner electrode, the outer heater being disposed above the outer electrode, and a ground electrode disposed between the outer heater and the outer electrode, wherein the multi-zone gas injection upper electrode has a plurality of concentric gas injection zones, each of the plurality of concentric gas injection zones including a first plurality of gas outlet ports and a second plurality of gas outlet ports, the first plurality of gas outlet ports configured for coupling to a first gas source and the second plurality of gas outlet ports configured for coupling to a second gas source,
a confinement structure surrounding the inner plasma region, the confinement structure having an upper horizontal wall that interfaces with the outer electrode of the multi-zone gas injection upper electrode such that a lower surface of the upper horizontal wall is disposed at a level that is substantially the same as a level at which a lower surface of the inner electrode of the multi-zone gas injection upper electrode is disposed, the confinement structure having a lower horizontal wall that interfaces with the substrate support, the lower horizontal wall including a perforated confinement ring, and the confinement structure having a vertical wall that extends from the upper horizontal wall to the lower horizontal wall, wherein each of the lower surface of the upper horizontal wall, an inner surface of the vertical wall, and an upper surface of the lower horizontal wall defines a boundary of an outer plasma region, the outer plasma region surrounding the inner plasma region; and
a controller coupled to the plasma chamber.

2. The plasma processing system of claim 1, wherein each one of the plurality of concentric gas injection zones includes a plurality of gas feeds, the plurality of gas feeds being evenly distributed around the corresponding gas injection zones.

3. The plasma processing system of claim 2, wherein a first plurality of gas feeds in a first concentric gas injection zone are aligned with a second plurality of gas feeds in a second concentric gas injection zone.

4. The plasma processing system of claim 2, wherein a first plurality of gas feeds in a first concentric gas injection zone are offset clockwise from a second plurality of gas feeds in a second concentric gas injection zone.

5. The plasma processing system of claim 2, wherein at least one of the plurality of gas feeds includes a plasma arrestor.

6. The plasma processing system of claim 5, wherein the plasma arrestor includes a plurality of small channels having a width sufficient to extinguish any plasma that reaches the plasma arrestor.

7. The plasma processing system of claim 5, wherein the plasma arrestor includes a ground electrode.

8. The plasma processing system of claim 1, further comprising an RF source coupled to the multi-zone gas injection upper electrode.

9. A plasma chamber comprising:
a substrate support;
a multi-zone gas injection upper electrode assembly disposed above the substrate support, the multi-zone gas injection upper electrode assembly including an insulator plate, a gas distribution plate disposed under and mounted on the insulator plate, and an inner electrode disposed under and mounted on the gas distribution plate and configured to receive a radio frequency (RF) signal, an outer electrode that surrounds but is separated from the inner electrode through an insulator, an inner heater disposed over the insulator plate and thermally coupled to the inner electrode, an outer heater disposed above the outer electrode and thermally coupled to the outer electrode via a ground electrode that is disposed between the outer heater and the outer electrode, and a plurality of concentric gas injection zones, each of the plurality of concentric gas injection zones including a first plurality of gas outlet ports and a second plurality of gas outlet ports, the first plurality of gas outlet ports configured to be coupled to a first gas source and the second plurality of gas outlet ports configured to be coupled to a second gas source; and
a confinement structure surrounding an inner plasma region defined between the multi-zone gas injection upper electrode and the substrate support, the confinement structure having an upper horizontal wall that interfaces with the outer electrode of the multi-zone gas injection upper electrode such that a lower surface of the upper horizontal wall is disposed at a level that is substantially the same as a level at which a lower surface of the inner electrode of the multi-zone gas injection upper electrode is disposed, the confinement structure having a lower horizontal wall that interfaces with the substrate support, the lower horizontal wall including a perforated confinement ring, and the confinement structure having a vertical wall that extends from the upper horizontal wall to the lower horizontal wall, wherein each of the lower surface of the upper horizontal wall, an inner surface of the vertical wall, and an upper surface of the lower horizontal wall defines a boundary of an outer plasma region, the outer plasma region surrounding the inner plasma region.

10. The plasma processing system of claim 1, wherein the lower horizontal wall interfaces with an edge ring of the substrate support.

11. The plasma chamber of claim 9, wherein the lower horizontal wall interfaces with an edge ring of the substrate support.

* * * * *